US005777569A

United States Patent [19]
Naruki et al.

[11] Patent Number: 5,777,569
[45] Date of Patent: Jul. 7, 1998

[54] ANALOG-TO-DIGITAL CONVERSION APPARATUS AND METHOD RELATED THERETO

[75] Inventors: Hidetoshi Naruki, Zama; Yasuo Satoh, Sagamihara, both of Japan

[73] Assignee: Victor Company of Japan, Ltd., Yokohama, Japan

[21] Appl. No.: 757,289

[22] Filed: Nov. 27, 1996

[30] Foreign Application Priority Data

Nov. 30, 1995 [JP] Japan ................................. 7-338011
Dec. 27, 1995 [JP] Japan ................................. 7-353239

[51] Int. Cl.$^6$ ................................................. H03M 1/06
[52] U.S. Cl. ....................................... 341/155; 341/118
[58] Field of Search ................................. 341/155, 139, 341/141, 118, 120

[56] References Cited

U.S. PATENT DOCUMENTS 4,823,129 4/1989 Nelson ................................. 341/139

Primary Examiner—Brian K. Young
Attorney, Agent, or Firm—Pollock, Vande Sande & Priddy

[57] ABSTRACT

An analog-to-digital conversion apparatus includes a plurality of amplifiers for amplifying a common input analog signal with predetermined different gains respectively. A plurality of analog-to-digital converters are operative for converting output signals of the amplifiers into corresponding first digital signals respectively, and for outputting the first digital signals respectively. A decision is made as to whether or not each of the first digital signals outputted by the analog-to-digital converters is in at least one of a given clipped state and a given full-scale over state. The first digital signals outputted by the analog-to-digital converters are corrected into respective second digital signals representing substantially equal levels. When none of the first digital signals is in at least one of the given clipped state and the given full-scale over state, one is selected out of all the second digital signals as a final digital output signal. When at least one of the first digital signals is in at least one of the given clipped state and the given full-scale over state, one is selected out of the second digital signals unrelated to the at least one of the first digital signals as a final digital output signal.

24 Claims, 24 Drawing Sheets 5,777,569

ANALOG-TO-DIGITAL CONVERSION APPARATUS AND METHOD RELATED THERETO

BACKGROUND OF THE INVENTION

1. Field of the Invention

This invention relates to an analog-to-digital (A/D) conversion apparatus. This invention also relates to a method related to analog-to-digital conversion.

2. Description of the Prior Art

A typical analog-to-digital (A/D) converter having a plural-bit output side tends to be low in resolution bit accuracy and to cause quantization errors when processing input signals with small levels (amplitudes).

A known A/D conversion apparatus of a floating type includes two amplifiers having different gains and followed by A/D converters, respectively. The two amplifiers operate on a common input analog signal. The A/D converters change output analog signals of the amplifiers into corresponding digital signals, respectively. One is selected from among the output digital signals of the A/D converters, and a final digital signal is generated in response to the selected signal. The A/D converters inevitably cause quantization errors in their output signals. Usually, the input analog signal has a noise component. Using the output digital signal of the A/D converter following the higher-gain amplifier is effective in reducing an adverse influence of the quantization errors and the noise on the final digital signal. In the known A/D conversion apparatus, the amplifier having the higher gain tends to fall into a signal clipping state (a saturated state) when the input analog signal has a great level. The change of the amplifier to the signal clipping state causes harmonics in its output signal which adversely affect the final digital signal.

SUMMARY OF THE INVENTION

It is an object of this invention to provide an improved analog-to-digital (A/D) conversion apparatus.

It is another object of this invention to provide an improved method related to analog-to-digital conversion.

A first aspect of this invention provides an analog-to-digital conversion apparatus comprising a plurality of amplifiers for amplifying a common input analog signal with predetermined different gains respectively; a plurality of analog-to-digital converters for converting output signals of the amplifiers into corresponding first digital signals respectively, and for outputting the first digital signals respectively; first means for deciding whether or not each of the first digital signals outputted by the analog-to-digital converters is in at least one of a given clipped state and a given full-scale over state; second means for correcting the first digital signals outputted by the analog-to-digital converters into respective second digital signals representing substantially equal levels; third means for, when the first means decides that none of the first digital signals is in at least one of the given clipped state and the given full-scale over state, selecting one out of all the second digital signals as a final digital output signal; and fourth means for, when the first means decides that at least one of the first digital signals is in at least one of the clipped state and the full-scale over state, selecting one out of the second digital signals unrelated to said at least one of the first digital signals as a final digital output signal.

A second aspect of this invention is based on the first aspect thereof, and provides an analog-to-digital conversion apparatus further comprising fifth means for, during a time interval after at least one of the first digital signals moves from at least one of the clipped state and the full-scale over state, continuing to select one out of the second digital signals unrelated to said at least one of the first digital signals as a final digital output signal.

A third aspect of this invention is based on the first aspect thereof, and provides an analog-to-digital conversion apparatus wherein said second digital signal selected by the fourth means originates from the output signal of the amplifier having a highest gains among the amplifiers unrelated to said at least one of the first digital signals.

A fourth aspect of this invention is based on the second aspect thereof, and provides an analog-to-digital conversion apparatus further comprising fifth means for detecting a condition of said at least one of the first digital signals being in at least one of the clipped state and the full-scale over state, and sixth means for controlling said time interval in response to the condition detected by the fifth means.

A fifth aspect of this invention is based on the first aspect thereof, and provides an analog-to-digital conversion apparatus wherein said second digital signal selected by the third means originates from the output signal of the amplifier having a highest gains among all the amplifiers.

A sixth aspect of this invention provides an analog-to-digital conversion apparatus comprising at least first and second amplifiers for amplifying a common input analog signal with first and second predetermined gains respectively, the first predetermined gain being higher than the second predetermined gain; at least first and second analog-to-digital converters for converting output signals of the first and second amplifiers into corresponding first and second digital signals respectively; first means for deciding whether or not the first digital signal is in a given saturated state; second means for correcting the first and second digital signals into third and fourth digital signals respectively to compensate for a variation between the first and second predetermined gains, the third and fourth digital signals representing substantially equal levels; third means for, when the first means decides that the first digital signal is not in the given saturated state, selecting the third digital signal from among the third and fourth digital signals as a final digital output signal; and fourth means for, when the first means decides that the first digital signal is in the given saturated state, selecting the fourth digital signal from among the third and fourth digital signals as a final digital output signal.

A seventh aspect of this invention is based on the sixth aspect thereof, and provides an analog-to-digital conversion apparatus further comprising fifth means for, during a time interval after the first digital signal moves out of the given saturated state, continuing to select the fourth digital signal from among the third and fourth digital signals as a final digital output signal.

An eighth aspect of this invention is based on the seventh aspect thereof, and provides an analog-to-digital conversion apparatus further comprising sixth means for detecting a condition of the first digital signal being in the given saturated state, and seventh means for controlling said time interval in response to the condition detected by the sixth means.

A ninth aspect of this invention provides a method of analog-to-digital conversion which comprising the steps of amplifying a common input analog signal with predetermined different gains into amplification-resultant analog signals respectively; digitizing the amplification-resultant analog signals into corresponding first digital signals respectively; correcting the first digital signals into second digital signals respectively to compensate for a variation among the gains, the second digital signals representing substantially equal levels; comparing a level represented by specified one of the second digital signals with at least one predetermined reference level; and combining the second digital signals at a combination ratio into a final digital output signal, the combination ratio depending on a result of said comparing.

A tenth aspect of this invention is based on the ninth aspect thereof, and provides a method further comprising the steps of deciding whether or not the level represented by the specified one of the second digital signals is increasing, and varying the combination ratio in response to whether or not the level represented by the specified one of the second digital signals is increasing.

An eleventh aspect of this invention is based on the ninth aspect thereof, and provides a method wherein the combination ratio is equal to either a first predetermined ratio or a second predetermined ratio different from the first predetermined ratio.

A twelfth aspect of this invention is based on the ninth aspect thereof, and provides a method wherein the combination ratio is changeable among at least three predetermined ratios different from each other.

A thirteenth aspect of this invention is based on the tenth aspect thereof, and provides a method further comprising the step of causing a rate of a variation in the combination ratio which occurs when the level represented by the specified one of the second digital signals is increasing to be greater than a rate of a variation in the combination ratio which occurs when the level represented by the specified one of the second digital signals is not increasing.

A fourteenth aspect of this invention is based on the tenth aspect thereof, and provides a method wherein a first given number of predetermined reference levels are used in the comparing when the level represented by the specified one of the second digital signals is increasing, and a second given number of predetermined reference levels are used in the comparing when the level represented by the specified one of the second digital signals is not increasing, the first given number being smaller than the second given number.

A fifteenth aspect of this invention is based on the ninth aspect thereof, and provides a method wherein two predetermined reference levels different from each other are used in the comparing.

A sixteenth aspect of this invention is based on the tenth aspect thereof, and provides a method further comprising the step of varying a rate of a variation in the combination ratio in response to the level represented by the specified one of the second digital signals.

A seventeenth aspect of this invention provides an analog-to-digital conversion apparatus comprising at least first and second amplifiers for amplifying a common input analog signal with first and second predetermined gains respectively, the first and second predetermined gains being different from each other; at least first and second analog-to-digital converters for converting output signals of the first and second amplifiers into corresponding first and second digital signals respectively; first means for correcting the first and second digital signals into third and fourth digital signals respectively to compensate for a variation between the first and second predetermined gains, the third and fourth digital signals representing substantially equal levels; and second means for combining the third and fourth digital signals into a final output digital signal.

An eighteenth aspect of this invention is based on the seventeenth aspect thereof, and provides an analog-to-digital conversion apparatus wherein the second means comprises means for combining the third and fourth digital signals into the final output digital signal by weighted average.

A nineteenth aspect of this invention is based on the seventeenth aspect thereof, and provides an analog-to-digital conversion apparatus wherein the second means comprises means for deciding whether or not a level represented by one of the third and fourth digital signals is in a predetermined range; and means for combining the third and fourth digital signals into the final output digital signal when the level represented by one of the third and fourth digital signal is in the predetermined range.

A twentieth aspect of this invention is based on the seventeenth aspect thereof, and provides an analog-to-digital conversion apparatus wherein the second means comprises means for combining the third and fourth digital signals at a variable combination ratio into the final output digital signal; and means for varying the combination ratio in response to a level represented by one of the third and fourth digital signals.

A twenty-first aspect of this invention is based on the seventeenth aspect thereof, and provides an analog-to-digital conversion apparatus wherein the second means comprises means for combining the third and fourth digital signals at a variable combination ratio into the final output digital signal; means for deciding whether or not a level represented by one of the third and fourth digital signal is increasing; and means for varying the combination ratio in response to whether or not the level represented by one of the third and fourth digital signal is increasing.

A twenty-second aspect of this invention provides an analog-to-digital conversion apparatus comprising at least first and second amplifiers for amplifying a common input analog signal with first and second predetermined gains respectively, the first and second predetermined gains being different from each other; at least first and second analog-to-digital converters for converting output signals of the first and second amplifiers into corresponding first and second digital signals respectively; first means for correcting the first and second digital signals into third and fourth digital signals respectively to compensate for a variation between the first and second predetermined gains, the third and fourth digital signals representing substantially equal levels; and second means for deciding which of first, second, and third predetermined ranges a level represented by one of the third and fourth digital signals is present in, the first, second, and third predetermined ranges being different from each other; third means for selecting the third digital signal as a final output digital signal when the second means decides that the level represented by one of the third and fourth digital signals is present in the first predetermined range; fourth means for combining the third and fourth digital signals into a final output digital signal when the second means decides that the level represented by one of the third and fourth digital signals is present in the second predetermined range; and fifth means for selecting the fourth digital signal as a final output digital signal when the second means decides that the level represented by one of the third and fourth digital signals is present in the third predetermined range.

A twenty-third aspect of this invention is based on the twenty-second aspect thereof, and provides an analog-to-digital conversion apparatus wherein the fourth means comprises means for combining the third and fourth digital signals into the final output digital signal by weighted average.

A twenty-fourth aspect of this invention is based on the twenty-second aspect thereof, and provides an analog-to-digital conversion apparatus wherein the fourth means comprises means for combining the third and fourth digital signals at a variable combination ratio into the final output digital signal; and means for varying the combination ratio in response to the level represented by one of the third and fourth digital signals.

A twenty-fifth aspect of this invention is based on the twenty-second aspect thereof, and provides an analog-to-digital conversion apparatus wherein the fourth means comprises means for combining the third and fourth digital signals at a variable combination ratio into the final output digital signal; means for deciding whether or not the level represented by one of the third and fourth digital signal is increasing; and means for varying the combination ratio in response to whether or not the level represented by one of the third and fourth digital signal is increasing.

DESCRIPTION OF THE PREFERRED EMBODIMENTS

First Embodiment

Figure 1:
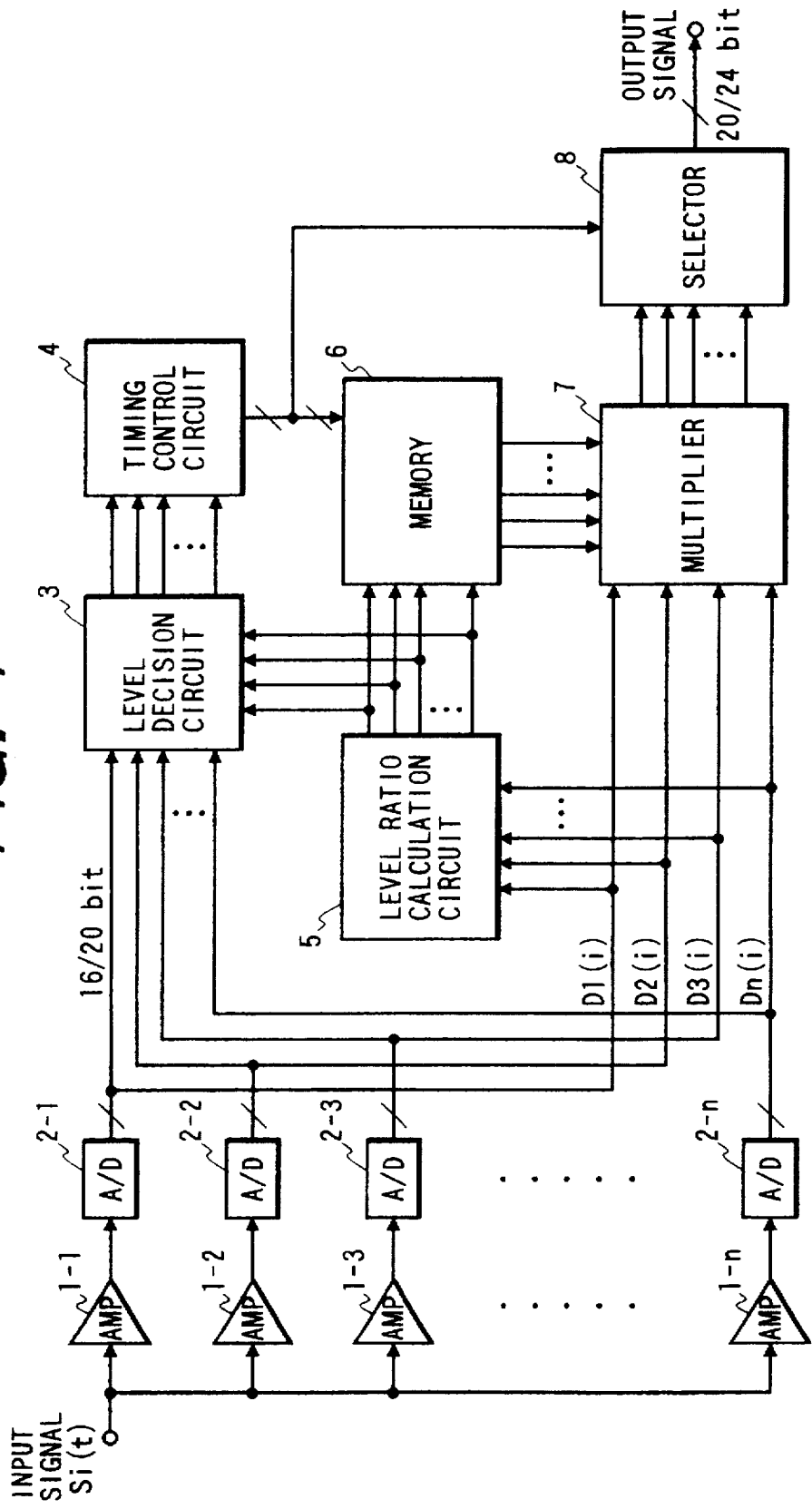
FIG. 1 is a block diagram of an analog-to-digital (A/D) conversion apparatus according to a first embodiment of this invention.

With reference to FIG. 1, an analog-to-digital (A/D) conversion apparatus includes "n" amplifiers 1-1, 1-2, ..., 1-n receiving an input analog signal Si(t) via an apparatus input terminal. Here, "n" denotes a predetermined natural number equal to or greater than 2. The amplifiers 1-1, 1-2, ..., 1-n have predetermined gains A1, A2, ..., An, respectively. The gains A1, A2, ..., An are different from each other. The gains A1, A2, ..., An have a given relation as A1<A2<...<An. The amplifiers 1-1, 1-2, ..., 1-n are followed by analog-to-digital (A/D) converters 2-1, 2-2, ..., 2-n, respectively.

The output terminals of the A/D converters 2-1, 2-2, ..., 2-n are connected to a level decision circuit 3, a level ratio calculation circuit 5, and a multiplier 7. The level decision circuit 3 is connected to a timing control circuit 4 and the level ratio calculation circuit 5. The timing control circuit 4 is connected to a memory 6 and a selector 8. The level ratio calculation circuit 5 is connected to the memory 6. The memory 6 is connected to the multiplier 7. The multiplier 7 is connected to the selector 8. The selector 8 is connected to an apparatus output terminal.

The amplifiers 1-1, 1-2, ..., 1-n enlarge the input analog signal Si(t) with the gains A1, A2, ..., An respectively. The amplifiers 1-1, 1-2, ..., 1-n output the resultant analog signals to the A/D converters 2-1, 2-2, ..., 2-n respectively. The A/D converters 2-1, 2-2, ..., 2-n periodically sample the output analog signals of the amplifiers 1-1, 1-2, ..., 1-n, and periodically quantize the resultant samples of the output analog signals of the amplifiers 1-1, 1-2, ..., 1-n into corresponding digital data pieces or samples D1(i), D2(i), ..., Dn(i) respectively. Here, "i" denotes a moment corresponding to a sample identification number or a sample order number which is incremented for every sampling period related to the operation of the A/D converters 2-1, 2-2, . . . , 2-n. The A/D converters 2-1, 2-2, . . . , 2-n output the digital data pieces D1(i), D2(i), . . . , Dn(i) to the level decision circuit 3, the level ratio calculation circuit 5, and the multiplier 7.

The amplifiers 1-1, 1-2, . . . , 1-n provide given clipping levels with respect to signals inputted thereto, respectively. The A/D converters 2-1, 2-2, . . . , 2-n provide given full-scale over levels with respect to signals inputted thereto, respectively. The level decision circuit 3 has information of the clipping levels or the full-scale over levels. In the case where the level decision circuit 3 has information of the clipping levels, the level decision circuit 3 uses the digital data piece D1(i) as an indication of the level or amplitude of the input analog signal Si(t), and compares the digital data piece D1(i) with the clipping levels to decide whether or not the input analog signal Si(t) is clipped by the amplifiers 1-1, 1-2, . . . , 1-n. In other words, the level decision circuit 3 decides whether or not the digital data pieces D1(i), D2(i), . . . , Dn(i) are in clipped states. The level decision circuit 3 outputs information of the result of this decision to the timing control circuit 4. In the case where the level decision circuit 3 has information of the full-scale over levels, the level decision circuit 3 uses the digital data piece D1(i) as an indication of the level or amplitude of the input analog signal Si(t), and compares the digital data piece D1(i) with the full-scale over levels to decide whether or not the input analog signal Si(t) is over the full scales of the A/D converters 2-1, 2-2, . . . , 2-n. In other words, the level decision circuit 3 decides whether or not the digital data pieces D1(i), D2(i), . . . , Dn(i) are in full-scale over states. The level decision circuit 3 outputs information of the result of this decision to the timing control circuit 4. In the case where the level decision circuit 3 has information of the clipping levels, the level decision circuit 3 calculates differences between the digital data piece D1(i) and the related clipping levels respectively to detect the degrees of clipping of the input analog signal Si(t) with respect to the respective amplifiers 1-1, 1-2, . . . , 1-n. The level decision circuit 3 outputs information of the detected degrees of clipping to the timing control circuit 4. In the case where the level decision circuit 3 has information of the full-scale over levels, the level decision circuit 3 calculates differences between the digital data piece D1(i) and the related full-scale over levels respectively to detect the degrees of over levels of the input analog signal Si(t) with respect to the respective A/D converters 2-1, 2-2, . . . , 2-n. The level decision circuit 3 outputs information of the detected degrees of over levels to the timing control circuit 4.

The timing control circuit 4 generates a control signal in response to the information fed from the level decision circuit 3. The timing control circuit 4 outputs the control signal to the memory 6 and the selector 8.

The level ratio calculation circuit 5 generates a reference signal in response to one of the digital data pieces D1(i), D2(i), . . . , Dn(i). The reference signal is designed in relation to a desired level of an output signal of the selector 8. For example, the level ratio calculation circuit 5 uses the digital data piece D1(i) as the reference signal. The level ratio calculation circuit 5 calculates ratios (level ratios) C1, C2, . . . , Cn between the reference signal and the digital data pieces D1(i), D2(i), . . . , Dn(i). The calculated level ratios C1, C2, . . . , Cn are used as level adjustment coefficients respectively. The level ratio calculation circuit 5 outputs signals of the level adjustment coefficients C1, C2, . . . , Cn to the memory 6.

The signals of the level adjustment coefficients C1, C2, . . . , Cn are stored into the memory 6 at a timing determined by the control signal fed from the timing control circuit 4. Storing signals into the memory 6 is periodically executed so that signals in the memory 6 are generally updated each time the signal storing process is implemented. The memory 6 outputs the signals of the level adjustment coefficients C1, C2, . . . , Cn to the multiplier 7.

The device 7 multiplies the digital data pieces D1(i), D2(i), . . . , Dn(i) by the level adjustment coefficients C1, C2, . . . , Cn respectively, and thereby generate digital data pieces C1·D1(i), C2·D2(i), . . . , Cn·Dn(i). The multiplier 7 subjects the digital data pieces D1(i), D2(i), . . . , Dn(i) to level adjustment processes in response to the level adjustment coefficients C1, C2, . . . , Cn respectively. The level adjustment processes compensate for a variation among the gains A1, A2, . . . , An. Thus, the levels represented by the digital data pieces C1·D1(i), C2·D2(i), . . . , Cn·Dn(i) are substantially equal to each other. The multiplier 7 outputs the digital data pieces C1·D1(i), C2·D2(i), . . . , Cn·Dn(i) to the selector 8.

The device 8 selects one out of the digital data pieces C1·D1(i), C2·D2(i), . . . , Cn·Dn(i) as a final digital signal sample or an apparatus output signal piece in response to the control signal fed from the timing control circuit 4. The selector 8 applies the selected digital data piece to the apparatus output terminal.

The control signal fed to the selector 8 from the timing control circuit 4 is designed to implement the following processes.

When the digital data pieces D1(i), D2(i), . . . , Dn(i) are in neither the clipped states nor the full-scale over states, the device 8 selects one out of the digital data pieces C1·D1(i), C2·D2(i), . . . , Cn·Dn(i) which originates from the output signal of the amplifier 1-n having the highest gain An. This signal selection is effective in reducing an adverse influence of quantization errors and input-analog-signal noise on the apparatus output signal. When some of the digital data pieces D1(i), D2(i), . . . , Dn(i) are in the clipped states or the full-scale over states, the selector 8 excludes digital data pieces among the digital data pieces C1·D1(i), C2·D2(i), . . . , Cn·Dn(i) from selection candidates which originate from the A/D converter output signals in the clipped states or the full-scale over states. In this case, the selector 8 uses the remaining digital data pieces as selection candidates, and selects one out of the remaining digital data pieces which originates from the output signal of the amplifier having the highest gain among the amplifiers related to neither the clipped states nor the full-scale over states. To prevent an adverse influence of harmonics, the selector 8 continues this selection for a controllable time interval after the clipping condition or the full-scale over condition disappears. Then, the selector 8 restarts to select the digital data piece which originates from the output signal of the amplifier 1-n having the highest gain An.

Figure 2:
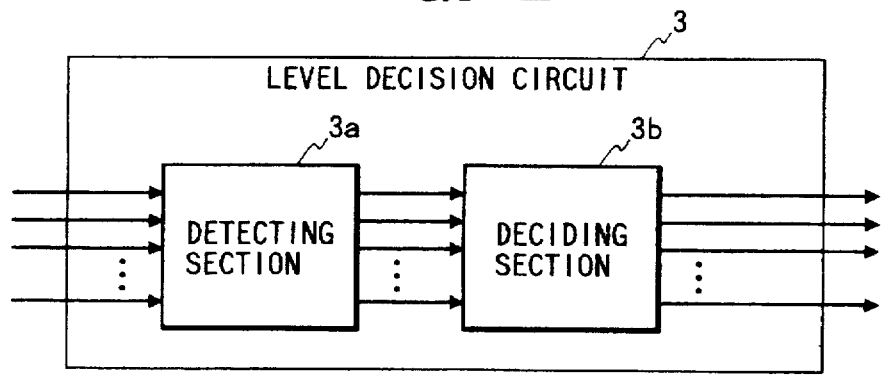
FIG. 2 is a block diagram of a level decision circuit in FIG. 1.

As shown in FIG. 2, the level decision circuit 3 includes a detecting section 3a and a deciding section 3b. The detecting section 3a receives the digital data pieces D1(i), D2(i), . . . , Dn(i) from the A/D converters 2-1, 2-2, . . . , 2-n. The deciding section 3b follows the detecting section 3a. The output side of the deciding section 3b is connected to the timing control circuit 4.

In the level decision circuit 3 of FIG. 2, the detecting section 3a detects the levels represented by the digital data pieces D1(i), D2(i), . . . , Dn(i) respectively. Here, the detected signal levels are also denoted by the characters D1(i), D2(i), . . . , Dn(i) respectively. The detecting section 3a informs the deciding section 3b of the detected signal levels D1(i), D2(i), ..., Dn(i). The deciding section 3b includes a memory storing signals representing predetermined threshold levels (predetermined reference levels) Vth1, Vth2, ..., Vthn corresponding to the clipping levels related to the amplifiers 1-1, 1-2, ..., 1-n or the full-scale over levels related to the A/D converters 2-1, 2-2, ..., 2-n, respectively. The deciding section 3b uses the detected signal level D1(i) as an indication of the level or amplitude of the input analog signal Si(t). The deciding section 3b includes calculators which compute differences |D1(i)|−|Vth1|, |D1(i)|−|Vth2|, ..., |D1(i)|−|Vthn| between the absolute values of the detected signal level D1(i) and the absolute values of the predetermined threshold levels Vth1, Vth2, ..., Vthn. The deciding section 3b includes comparators which decide whether the computed differences |D1(i)|−|Vth1|, |D1(i)|−|Vth2|, ..., |D1(i)|−|Vthn| are zero, positive, or negative. The deciding section 3b feeds the timing control circuit 4 with signals representing whether the computed differences |D1(i)|−|Vth1|, |D1(i)|−|Vth2|, ..., |D1(i)|−|Vthn| are zero, positive, or negative. A computed difference being zero indicates that the output signal of a related A/D converter is in neither the clipped state nor the full-scale over state. A computed difference being positive indicates that the output signal of a related A/D converter is in the clipped state or the full-scale over state. A computed difference being negative indicates that the output signal of a related A/D converter is in neither the clipped state nor the full-scale over state. The computed differences |D1(i)|−|Vth1|, |D1(i)|−|Vth2|, ..., |D1(i)|−|Vthn| between the absolute value of the detected signal level D1(i) and the absolute values of the predetermined threshold levels Vth1, Vth2, ..., Vthn are used as indications of the degrees of over levels of the input analog signal Si(t) with respect to the respective A/D converters 2-1, 2-2, ..., 2-n or as indications of the degrees of clipping of the input analog signal Si(t) with respect to the amplifiers 1-1, 1-2, ..., 1-n. The deciding section 3b feeds the timing control circuit 4 with signals representing the computed differences |D1(i)|−|Vth1|, |D1(i)|−|Vth2|, ..., |D1(i)|−|Vthn|.

Figure 3:
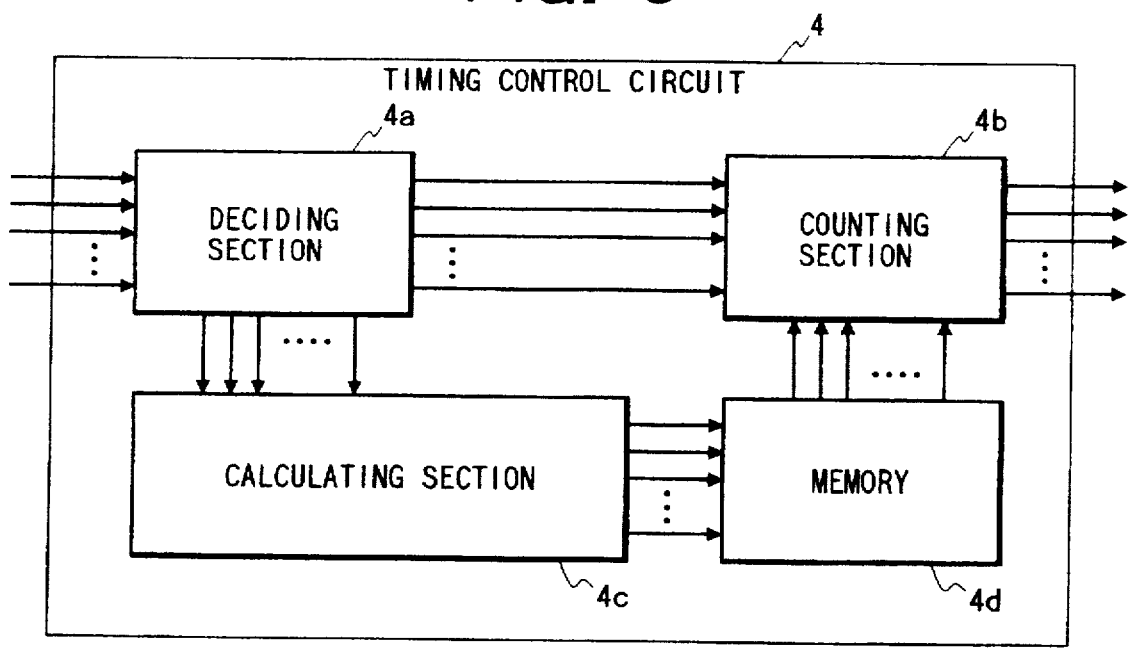
FIG. 3 is a block diagram of a timing control circuit in FIG. 1.

As shown in FIG. 3, the timing control circuit 4 includes a deciding section 4a, a counting section 4b, a calculating section 4c, and a memory 4d. The deciding section 4a receives the output signals of the deciding section 3b in the level decision circuit 3. The deciding section 4a is connected to the counting section 4b and the calculating section 4c. The counting section 4b and the calculating section 4c are connected to the memory 4d. The counting section 4b is connected to the memory 6 and the selector 8.

The deciding section 4a receives, from the deciding section 3b in the level decision circuit 3, the information of the computed differences |D1(i)|−|Vth1|, |D1(i)|−|Vth2|, ..., |D1(i)|−|Vthn| and also the information of whether or not the output signals of the A/D converters 2-1, 2-2, ..., 2-n are in the clipped states (or the full-scale over states). The deciding section 4a transfers the information to the counting section 4b and the calculating section 4c. For each of the output signals of the A/D converters 2-1, 2-2, ..., 2-n, the calculating section 4c detects, in response to the information fed from the deciding section 4a, the time interval during which the A/D converter output signal continues to be in the clipped state or the full-scale over state. For each of the A/D converter output signals in the clipped states or the full-scale over states, the calculating section 4c computes an accumulation value CT1 of the difference |D1(i)|−|Vth1| by referring to the following equation.

$$CT1 = \sum_{i=smpS}^{smpE} \{|D1(i)| - |Vth1|\}/m \quad (1)$$

where "smpS" denotes a sample order number corresponding to the moment of the start of the clipping condition or the full-scale over condition; "smpE" denotes a current sample order number corresponding to the moment of the end of the clipping condition or the full-scale over condition; and "m" denotes a predetermined constant equal to, for example, 1. Generally, the computed accumulation values increase as the degrees of clipping or the degrees of full-scale over rise. In addition, the computed accumulation values increase as the life times (the duration times) of the clipping conditions or the full-scale over conditions lengthen. When the clipping condition or the full-scale over condition disappears, the calculating section 4c resets the related accumulation value to "0". The calculating section 4c stores signals of the computed accumulation values into the memory 4d.

The counting section 4b receives, from the deciding section 4a, the information of whether or not the output signals of the A/D converters 2-1, 2-2, ..., 2-n are in the clipped states (or the full-scale over states). The counting section 4b reads out the signals of the accumulation values from the memory 4d. The counting section 4b counts pulses of a clock signal to decide a timing, and thereby generates a control signal (or control signals) in response to the received information and the readout signals. The counting section 4b outputs the generated control signal (or signals) to the memory 6 and the selector 8.

The control signal fed to the selector 8 from the counting section 4b in the timing control circuit 4 is designed to implement the following processes. When the digital data pieces D1(i), D2(i), ..., Dn(i) are in neither the clipped states nor the full-scale over states, the device 8 selects one out of the digital data pieces C1·D1(i), C2·D2(i), ..., Cn·Dn(i) which originates from the output signal of the amplifier 1-n having the highest gain An. This signal selection is effective in reducing an adverse influence of quantization errors and input-analog-signal noise on the apparatus output signal. When some of the digital data pieces D1(i), D2(i), ..., Dn(i) are in the clipped states or the full-scale over states, the selector 8 excludes digital data pieces among the digital data pieces C1·D1(i), C2·D2(i), ..., Cn·Dn(i) from selection candidates which originate from the A/D converter output signals in the clipped states or the full-scale over states. In this case, the selector 8 uses the remaining digital data pieces as selection candidates, and selects one out of the selection-candidate digital data pieces which originates from the output signal of the amplifier having the highest gain among the amplifiers related to neither the clipped states nor the full-scale over states. To prevent an adverse influence of harmonics, the selector 8 continues this selection for a time interval after the clipping condition or the full-scale over condition disappears. The time interval depends on the related accumulation value. Specifically, the time interval lengthens as the related accumulation value increases. Then, the selector 8 restarts to select the digital data piece which originates from the output signal of the amplifier 1-n having the highest gain An.

In cases where the predetermined natural number "n" is equal to 2, the A/D conversion apparatus of FIG. 1 operates as follows. It is now assumed that as shown in the portion (A) of FIG. 4, the data piece D1(i) remains in a normal state other than the clipped state (or the full-scale over state) while the data piece D2(i) changes between a normal state and the clipped state (or the full-scale over state). Specifically, the data piece D2(i) changes from the normal state to the clipped state (or the full-scale over state) at a moment t1. During a time interval until the moment t1, the device 8 continues to select the data piece C2·D2(i) which originates from the output signal of the amplifier 1-2 having the higher gain A2. At the moment t1, the device 8 selects the data piece C1·D1(i) which originates from the output signal of the amplifier 1-1 having the lower gain A1.

Figure 4:
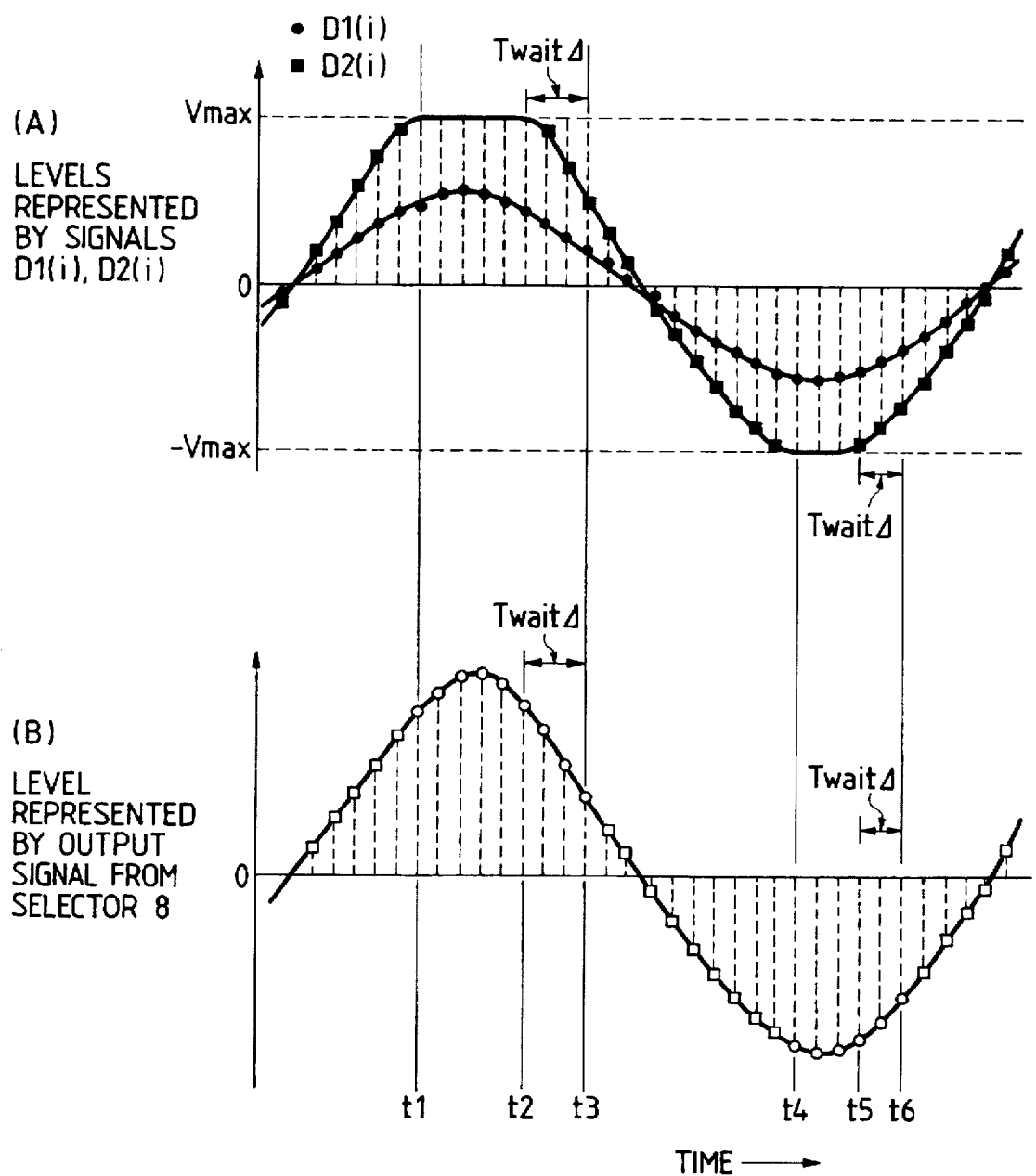
FIG. 4 is a time-domain diagram of signals in a first example of the apparatus of FIG. 1.

As shown in the portion (A) of FIG. 4, the data piece D2(i) returns to the normal state from the clipped state (or the full-scale over state) at a moment t2 following the moment t1. During the time interval between the moment t1 and a moment t3, the device 8 continues to select the data piece C1·D1(i) which originates from the output signal of the amplifier 1-1 having the lower gain A1. The moment t3 follows the moment t2 by a time interval TwaitΔ which is determined in accordance with the accumulation value CT2 of the difference |D1(i)|−|Vth2| related to the clipping condition (or the full-scale over condition). Therefore, as shown in the portion (B) of FIG. 4, during the time interval between the moments t1 and t2, the final digital signal outputted from the selector 8 is substantially prevented from being saturated. In addition, during the time interval TwaitΔ after the moment t2 of the return of the data piece D2(i) to the normal state from the clipped state (or the full-scale over state), the selector 8 continues to select the data piece C1·D1(i) rather than the data piece C2·D2(i). The time interval TwaitΔ is chosen to cover a time range in which the data piece C2·D2(i) remains contaminated by harmonics resulting from the clipping condition (or the full-scale over condition). Thus, the final digital signal outputted from the selector 8 is substantially free from harmonics-based errors. At the moment t3, the device 8 selects the data piece C2·D2(i) which originates from the output signal of the amplifier 1-2 having the higher gain A2.

As shown in the portion (A) of FIG. 4, the data piece D2(i) remains in the normal state until a moment t4. The moment t4 follows the moment t3. The data piece D2(i) changes from the normal state to the clipped state (or the full-scale over state) at the moment t4. During the time interval between the moments t3 and t4, the device 8 continues to select the data piece C2·D2(i) which originates from the output signal of the amplifier 1-2 having the higher gain A2. At the moment t4, the device 8 selects the data piece C1·D1(i) which originates from the output signal of the amplifier 1-1 having the lower gain A1.

As shown in the portion (A) of FIG. 4, the data piece D2(i) returns to the normal state from the clipped state (or the full-scale over state) at a moment t5 following the moment t4. During the time interval between the moment t4 and a moment t6, the device 8 continues to select the data piece C1·D1(i) which originates from the output signal of the amplifier 1-1 having the lower gain A1. The moment t6 follows the moment t5 by a time interval TwaitΔ which is determined in accordance with the accumulation value CT2 of the difference |D1(i)|−|Vth2| related to the clipping condition (or the full-scale over condition). Therefore, as shown in the portion (B) of FIG. 4, during the time interval between the moments t4 and t5, the final digital signal outputted from the selector 8 is substantially prevented from being saturated. In addition, during the time interval TwaitΔ after the moment t5 of the return of the data piece D2(i) to the normal state from the clipped state (or the full-scale over state), the selector 8 continues to select the data piece C1·D1(i) rather than the data piece C2·D2(i). The time interval TwaitΔ is chosen to cover a time range in which the data piece C2·D2(i) remains contaminated by harmonics resulting from the clipping condition (or the full-scale over condition).

Thus, the final digital signal outputted from the selector 8 is substantially free from harmonics-based errors. At the moment t6, the device 8 selects the data piece C2·D2(i) which originates from the output signal of the amplifier 1-2 having the higher gain A2.

In cases where the predetermined natural number "n" is equal to 3, the A/D conversion apparatus of FIG. 1 operates as follows. It is now assumed that as shown in the portion (A) of FIG. 5, the data piece D1(i) remains in a normal state other than the clipped state (or the full-scale over state) while the data pieces D2(i) and D3(i) change between normal states and the clipped states (or the full-scale over states). Specifically, the data piece D3(i) changes from the normal state to the clipped state (or the full-scale over state) at a moment t11. During a time interval until the moment t11, the device 8 continues to select the data piece C3·D3(i) which originates from the output signal of the amplifier 1-3 having the highest gain A3. At the moment t11, the device 8 selects the data piece C2·D2(i) which originates from the output signal of the amplifier 1-2 having the intermediate gain A2.

Figure 5:
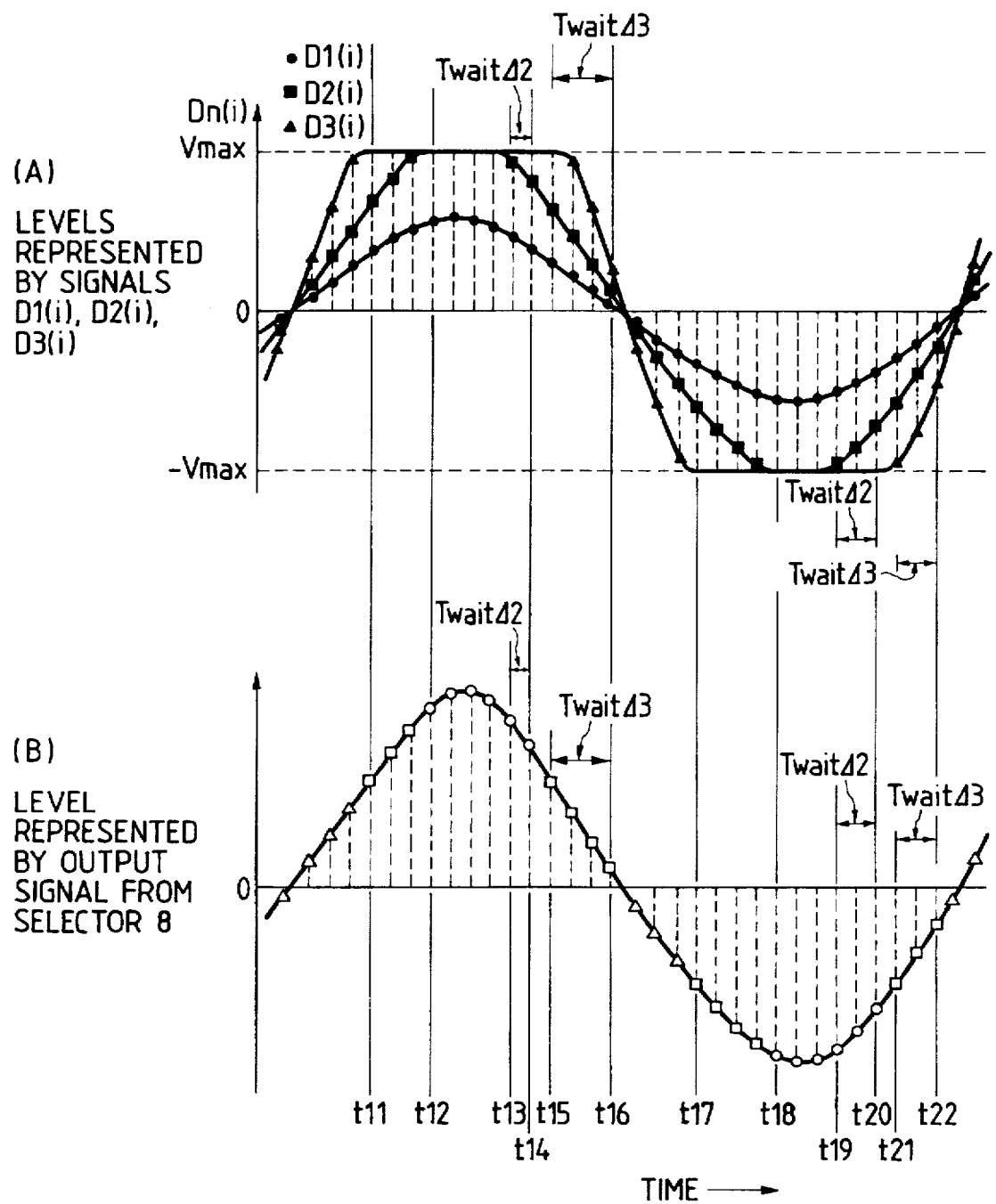
FIG. 5 is a time-domain diagram of signals in a second example of the apparatus of FIG. 1.

As shown in the portion (A) of FIG. 5, the data piece D2(i) changes from the normal state to the clipped state (or the full-scale over state) at a moment t12 following the moment t11. During the time interval between the moments t11 and t12, the device 8 continues to select the data piece C2·D2(i) which originates from the output signal of the amplifier 1-2 having the intermediate gain A2. Therefore, as shown in the portion (B) of FIG. 5, during the time interval between the moments t11 and t12, the final digital signal outputted from the selector 8 is substantially prevented from being saturated. At the moment t12, the device 8 selects the data piece C1·D1(i) which originates from the output signal of the amplifier 1-1 having the lowest gain A1.

As shown in the portion (A) of FIG. 5, the data piece D2(i) returns to the normal state from the clipped state (or the full-scale over state) at a moment t13 following the moment t12. During the time interval between the moment t12 and a moment t14, the device 8 continues to select the data piece C1·D1(i) which originates from the output signal of the amplifier 1-1 having the lowest gain A1. The moment t14 follows the moment t13 by a time interval TwaitΔ2 which is determined in accordance with the accumulation value CT2 of the difference |D1(i)|−|Vth2| related to the clipping condition (or the full-scale over condition). Therefore, as shown in the portion (B) of FIG. 5, during the time interval between the moments t12 and t13, the final digital signal outputted from the selector 8 is substantially prevented from being saturated. In addition, during the time interval TwaitΔ2 after the moment t13 of the return of the data piece D2(i) to the normal state from the clipped state (or the full-scale over state), the selector 8 continues to select the data piece C1·D1(i) rather than the data piece C2·D2(i). The time interval TwaitΔ2 is chosen to cover a time range in which the data piece C2·D2(i) remains contaminated by harmonics resulting from the clipping condition (or the full-scale over condition). Thus, the final digital signal outputted from the selector 8 is substantially free from harmonics-based errors. At the moment t14, the device 8 selects the data piece C2·D2(i) which originates from the output signal of the amplifier 1-2 having the intermediate gain A2.

As shown in the portion (A) of FIG. 5, the data piece D3(i) returns to the normal state from the clipped state (or the full-scale over state) at a moment t15 following the moment t14. During the time interval between the moment t14 and a moment t16, the device 8 continues to select the data piece C2·D2(i) which originates from the output signal of the amplifier 1-2 having the intermediate gain A2. The moment t16 follows the moment t15 by a time interval TwaitΔ3 which is determined in accordance with the accumulation value CT3 of the difference |D1(i)|−|Vth3| related to the clipping condition (or the full-scale over condition). Therefore, as shown in the portion (B) of FIG. 5, during the time interval between the moments t13 and t15, the final digital signal outputted from the selector 8 is substantially prevented from being saturated. In addition, during the time interval TwaitΔ3 after the moment t15 of the return of the data piece D3(i) to the normal state from the clipped state (or the full-scale over state), the selector 8 continues to select the data piece C2·D2(i) rather than the data piece C3·D3(i). The time interval TwaitΔ3 is chosen to cover a time range in which the data piece C3·D3(i) remains contaminated by harmonics resulting from the clipping condition (or the full-scale over condition). Thus, the final digital signal outputted from the selector 8 is substantially free from harmonics-based errors. At the moment t16, the device 8 selects the data piece C3·D3(i) which originates from the output signal of the amplifier 1-3 having the highest gain A3.

As shown in the portion (A) of FIG. 5, the data piece D3(i) remains in the normal state until a moment t17. The moment t17 follows the moment t16. The data piece D3(i) changes from the normal state to the clipped state (or the full-scale over state) at the moment t17. During the time interval between the moments t16 and t17, the device 8 continues to select the data piece C3·D3(i) which originates from the output signal of the amplifier 1-3 having the highest gain A3. At the moment t17, the device 8 selects the data piece C2·D2(i) which originates from the output signal of the amplifier 1-2 having the intermediate gain A2.

As shown in the portion (A) of FIG. 5, the data piece D2(i) changes from the normal state to the clipped state (or the full-scale over state) at a moment t18 following the moment t17. During the time interval between the moments t17 and t18, the device 8 continues to select the data piece C2·D2(i) which originates from the output signal of the amplifier 1-2 having the intermediate gain A2. Therefore, as shown in the portion (B) of FIG. 5, during the time interval between the moments t17 and t18, the final digital signal outputted from the selector 8 is substantially prevented from being saturated. At the moment t18, the device 8 selects the data piece C1·D1(i) which originates from the output signal of the amplifier 1-1 having the lowest gain A1.

As shown in the portion (A) of FIG. 5, the data piece D2(i) returns to the normal state from the clipped state (or the full-scale over state) at a moment t19 following the moment t17. During the time interval between the moment t17 and a moment t20, the device 8 continues to select the data piece C1·D1(i) which originates from the output signal of the amplifier 1-1 having the lowest gain A1. The moment t20 follows the moment t19 by a time interval TwaitΔ2 which is determined in accordance with the accumulation value CT2 of the difference |D1(i)|−|Vth2| related to the clipping condition (or the full-scale over condition). Therefore, as shown in the portion (B) of FIG. 5, during the time interval between the moments t18 and t19, the final digital signal outputted from the selector 8 is substantially prevented from being saturated. In addition, during the time interval TwaitΔ2 after the moment t19 of the return of the data piece D2(i) to the normal state from the clipped state (or the full-scale over state), the selector 8 continues to select the data piece C1·D1(i) rather than the data piece C2·D2(i). The time interval TwaitΔ2 is chosen to cover a time range in which the data piece C2·D2(i) remains contaminated by harmonics resulting from the clipping condition (or the full-scale over condition). Thus, the final digital signal outputted from the selector 8 is substantially free from harmonics-based errors. At the moment t20, the device 8 selects the data piece C2·D2(i) which originates from the output signal of the amplifier 1-2 having the intermediate gain A2.

As shown in the portion (A) of FIG. 5, the data piece D3(i) returns to the normal state from the clipped state (or the full-scale over state) at a moment t21 following the moment t20. During the time interval between the moment t20 and a moment t22, the device 8 continues to select the data piece C2·D2(i) which originates from the output signal of the amplifier 1-2 having the intermediate gain A2. The moment t22 follows the moment t21 by a time interval TwaitΔ3 which is determined in accordance with the accumulation value CT3 of the difference |D1(i)|−|Vth3| related to the clipping condition (or the full-scale over condition). Therefore, as shown in the portion (B) of FIG. 5, during the time interval between the moments t19 and t21, the final digital signal outputted from the selector 8 is substantially prevented from being saturated. In addition, during the time interval TwaitΔ3 after the moment t21 of the return of the data piece D3(i) to the normal state from the clipped state (or the full-scale over state), the selector 8 continues to select the data piece C2·D2(i) rather than the data piece C3·D3(i). The time interval TwaitΔ3 is chosen to cover a time range in which the data piece C3·D3(i) remains contaminated by harmonics resulting from the clipping condition (or the full-scale over condition). Thus, the final digital signal outputted from the selector 8 is substantially free from harmonics-based errors. At the moment t22, the device 8 selects the data piece C3·D3(i) which originates from the output signal of the amplifier 1-3 having the highest gain A3.

Second Embodiment

Figure 6:
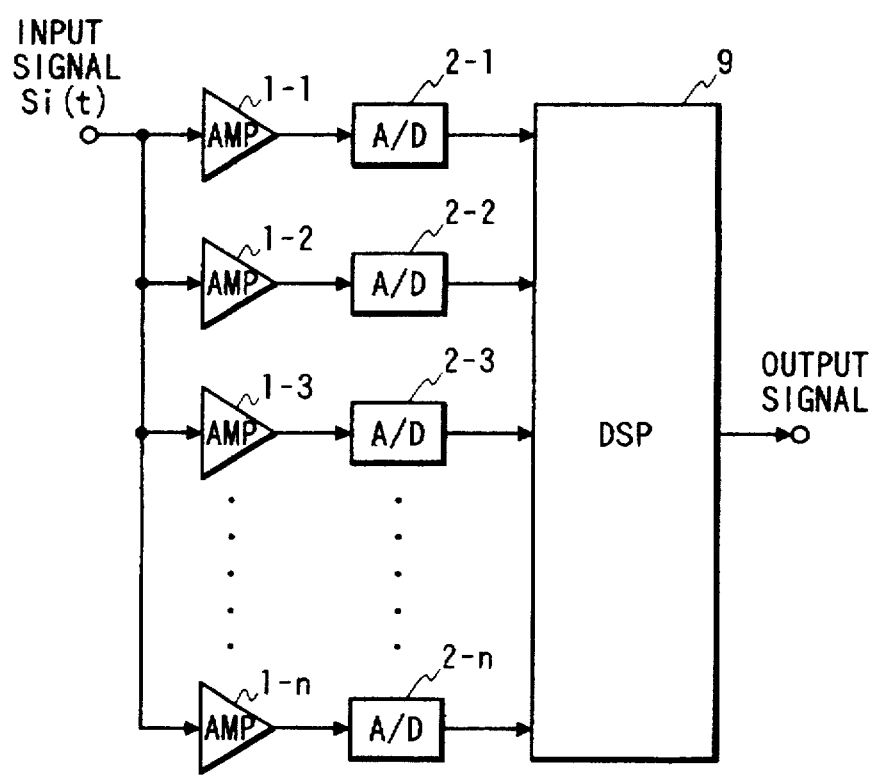
FIG. 6 is a block diagram of an analog-to-digital (A/D) conversion apparatus according to a second embodiment of this invention.

FIG. 6 shows an analog-to-digital (A/D) conversion apparatus according to a second embodiment of this invention. The A/D conversion apparatus of FIG. 6 is similar to the A/D conversion apparatus of FIG. 1 except for design changes indicated later.

The A/D conversion apparatus of FIG. 6 includes "n" amplifiers 1-1, 1-2, . . . , 1-n receiving an input analog signal Si(t) via an apparatus input terminal. Here, "n" denotes a predetermined natural number equal to or greater than 2. The amplifiers 1-1, 1-2, . . . , 1-n have predetermined gains A1, A2, . . . , An, respectively. The gains A1, A2, . . . , An are different from each other. The gains A1, A2, . . . , An have a given relation as A1<A2<. . . <An. The amplifiers 1-1, 1-2, . . . , 1-n are followed by analog-to-digital (A/D) converters 2-1, 2-2, . . . , 2-n, respectively. The output terminals of the A/D converters 2-1, 2-2, . . . , 2-n are connected to a digital signal processor (a DSP) 9. The digital signal processor 9 may be replaced by a microprocessor, a CPU, or a similar device.

The amplifiers 1-1, 1-2, . . . , 1-n enlarge the input analog signal Si(t) with the gains A1, A2, . . . , An respectively. The amplifiers 1-1, 1-2, . . . , 1-n output the resultant analog signals to the A/D converters 2-1, 2-2, . . . , 2-n respectively. The A/D converters 2-1, 2-2, . . . , 2-n periodically sample the output analog signals of the amplifiers 1-1, 1-2, . . . , 1-n, and periodically quantize the resultant samples of the output analog signals of the amplifiers 1-1, 1-2, . . . , 1-n into corresponding digital data pieces or samples D1(i), D2(i), . . . , Dn(i) respectively. Here, "i" denotes a moment corresponding to a sample identification number or a sample order number which is incremented for every sampling period. The A/D converters 2-1, 2-2, . . . , 2-n output the digital data pieces D1(i), D2(i), . . . , Dn(i) to the digital signal processor 9.

The digital signal processor 9 generates a time segment (a sample) of a final digital signal in response to the digital data pieces D1(i), D2(i), . . . , Dn(i). The digital signal processor 9 outputs the time segment of the final digital signal as an indication of the result of analog-to-digital conversion of the sample of the input analog signal Si(t).

The amplifiers 1-1, 1-2, . . . , 1-n provide given clipping levels with respect to signals inputted thereto, respectively. The A/D converters 2-1, 2-2, . . . , 2-n provide given full-scale over levels with respect to signals inputted thereto, respectively.

Figure 7:
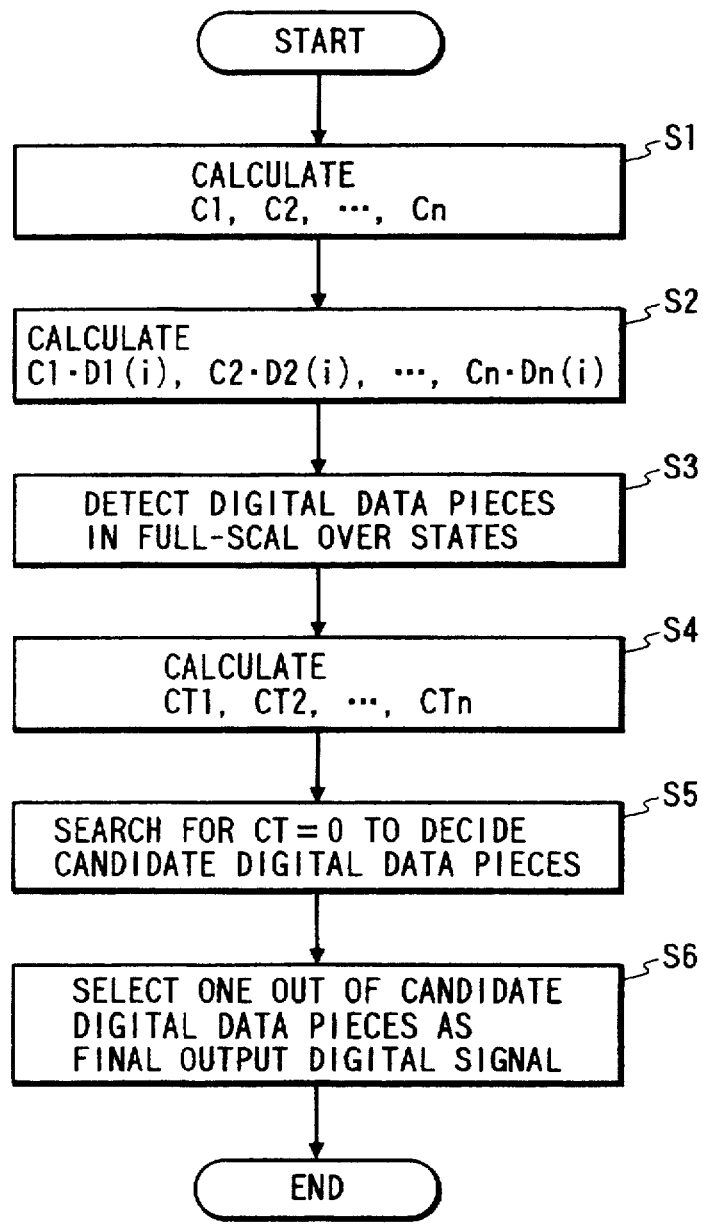
FIG. 7 is a flowchart of a segment of a program for controlling a digital signal processor in FIG. 6.

The digital signal processor 9 includes a combination of an input/output port (an interface), a processing section, a RAM, and a ROM. The digital signal processor 9 operates in accordance with a program stored in the ROM. FIG. 7 is a flowchart of a segment of the program which is executed for every sampling period related to the operation of the A/D converters 2-1, 2-2, . . . , 2-n.

As shown in FIG. 7, a first step S1 of the program segment generates a reference signal in response to one of the digital data pieces D1(i), D2(i), . . . , Dn(i). For example, the step S1 uses the digital data piece D1(i) as the reference signal. The step S1 calculates ratios (level ratios) C1, C2, . . . , Cn between the level represented by the reference signal and the levels represented by the digital data pieces D1(i), D2(i), . . . , Dn(i). Hereinafter, the levels represented by the digital data pieces will also be denoted by D1(i), D2(i), . . . , Dn(i) respectively. The reference signal is chosen or designed in relation to a desired level of a final output digital signal. The calculated level ratios C1, C2, . . . , Cn are used as level adjustment coefficients respectively.

A step S2 subsequent to the step S1 multiplies the digital data pieces D1(i), D2(i), . . . , Dn(i) by the level adjustment coefficients C1C2, . . . , Cn respectively, and thereby generates digital data pieces C1·D1(i), C2·D2(i), . . . , Cn·Dn(i). Accordingly, the step S2 subjects the digital data pieces D1(i), D2(i), . . . , Dn(i) to level adjustment processes in response to the level adjustment coefficients C1, C2, . . . , Cn respectively. The level adjustment processes compensate for a variation among the gains A1, A2, An. Thus, the levels represented by the digital data pieces C1·D1(i), C2·D2 (i), . . . , Cn·Dn(i) are substantially equal to each other.

A step S3 following the step S2 calculates differences |D1(i)|–|Vth1|, |D1(i)|–|Vth2|, . . . , |D1(i)|–|Vthn| between the absolute value of the digital data level D1(i) and the absolute values of predetermined threshold levels Vth1, Vth2, . . . , Vthn. The digital data level D1(i) is used as an indication of the level of the input analog signal Si(t). The predetermined threshold levels Vth1, Vth2, . . . , Vthn correspond to the clipping levels related to the amplifiers 1-1, 1-2, . . . , 1-n or the full-scale over levels related to the A/D converters 2-1, 2-2, . . . , 2-n, respectively. The step S3 decides whether or not the calculated differences |D1(i)|–|Vth1|, |D1(i)|–|Vth2|, . . . , D1(i)|–|Vthn| are positive, that is, whether or not the digital data pieces D1(i), D2(i), . . . , Dn(i) are in the clipped states (or the full-scale over states). Accordingly, the step S3 detects digital data pieces among the digital data pieces D1(i), D2(i), . . . , Dn(i) which are in the clipped states (or the full-scale over states). Furthermore, the step S3 separates the digital data pieces D1(i), D2(i), . . . , Dn(i) into a groups of digital data pieces in the clipped states (or the full-scale over states) and a group of digital data pieces out of the clipped states (or the full-scale over states).

A step S4 subsequent to the step S3 uses the differences |D1(i)|–|Vth1|, |D1(i)|–|Vth2|, . . . , |D1(i)|–|Vthn| as indications of the degrees of over levels of the input analog signal Si(t) with respect to the respective A/D converters 2-1, 2-2, . . . , 2-n or as indications of the degrees of clipping of the input analog signal Si(t) with respect to the amplifiers 1-1, 1-2, . . . , 1-n. The step S4 calculates and updates condition-indicating values CT1, CT2, . . . , CTn assigned to the digital data pieces D1(i), D2(i), . . . Dn(i), or the digital data pieces C1·D1(i), C2·D2(i), . . . , Cn·Dn(i), respectively. For each of digital data pieces in the clipped states (or the full-scale over states), the step S4 increments the related condition-indicating value CT1 by the related difference |D1(i)|–|Vth1| divided by a predetermined constant "m". For each of digital data pieces out of the clipped states (or the full-scale over states), the step S4 decrements the related condition-indicating value CT1 by a predetermined value. In this case, the step S4 holds the related condition-indicating value CT1 equal to "0" when the value CT1 has already reached "0".

A step S5 following the step S4 decides whether or not each of the calculated condition-indicating values CT1, CT2, . . . , CTn is equal to "0". In other words, the step S5 searches for condition-indicating values of "0".

A step S6 subsequent to the step S5 detects selection-candidate digital data pieces among the digital data pieces C1·D1(i), C2·D2(i), . . . , Cn·Dn(i) which correspond to the condition-indicating values of "0" respectively. The step S6 selects one out of the selection-candidate digital data pieces which relates to an A/D converter having the highest gain among the A/D converters outputting the original signals for the selection-candidate digital data pieces. The step S6 outputs the selected digital data piece as a time segment of the final output digital signal. After the step S6, the current execution cycle of the program segment ends.

Figure 8:
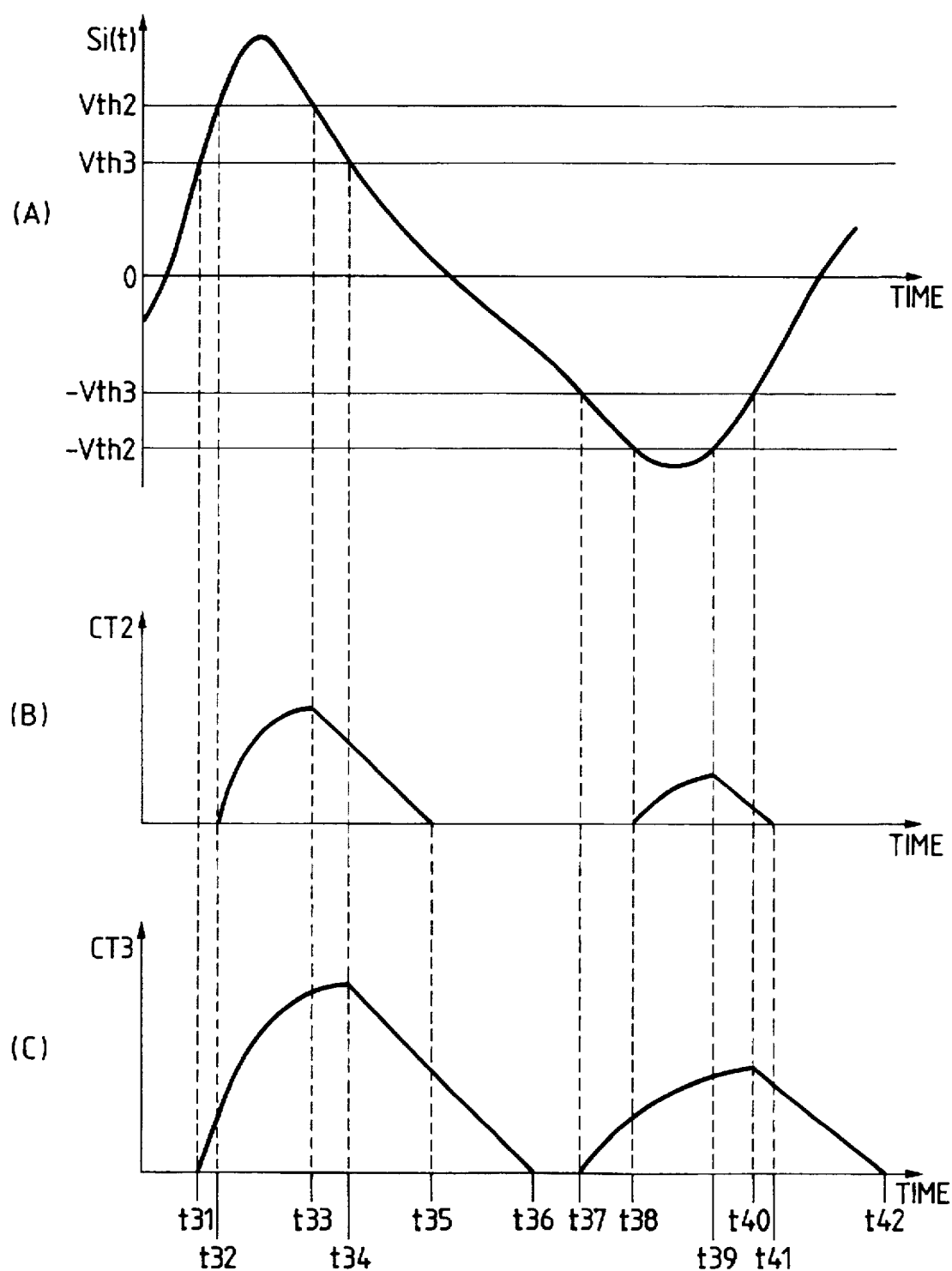
FIG. 8 is a time-domain diagram of an input analog signal, and values calculated in the apparatus of FIG. 7.

It is now assumed that the level of the input analog signal Si(t) varies in time domain as shown in the portion (A) of FIG. 8. The level of the input analog signal Si(t) increases across the positive threshold level Vth3 at a moment t31. As shown in the portion (A) of FIG. 8, the level of the input analog signal Si(t) remains higher than the positive threshold level Vth3 during the time interval from the moment t31 to a moment t34. Accordingly, as shown in the portion (C) of FIG. 8, during the time interval between the moments t31 and t34, the condition-indicating value CT3 related to the threshold level Vth3 increases from "0" at a rate depending on the related difference |D1(i)|–|Vth3|.

As shown in the portion (A) of FIG. 8, the level of the input analog signal Si(t) increases across the positive threshold level Vth2 at a moment t32 following the moment t31 but preceding the moment t34. The level of the input analog signal Si(t) remains higher than the positive threshold level Vth2 during the time interval from the moment t32 to a moment t33 preceding the moment t34. Accordingly, as shown in the portion (B) of FIG. 8, during the time interval between the moments t32 and t33, the condition-indicating value CT2 related to the threshold level Vth2 increases from "0" at a rate depending on the related difference |D1(i)|–|Vth2|.

As shown in the portion (A) of FIG. 8, the level of the input analog signal Si(t) decreases across the positive threshold value Vth2 at the moment t33. During the time interval from the moment t33 to a moment t38, the level of the input analog signal Si(t) remains lower than the positive threshold level Vth2 and higher than the negative threshold level –Vth2. Thus, as shown in the portion (B) of FIG. 8, during the time interval after the moment t33, the condition-indicating value CT2 related to the threshold level Vth2 decreases at a constant rate. The condition-indicating value CT2 drops to "0" at a moment t35 preceding the moment t38.

As shown in the portion (A) of FIG. 8, the level of the input analog signal Si(t) decreases across the positive threshold value Vth3 at the moment t34. During the time interval from the moment t34 to a moment t37 preceding the moment t38 but following the moment t35, the level of the input analog signal Si(t) remains lower than the positive threshold level Vth3 and higher than the negative threshold level −Vth3. Thus, as shown in the portion (C) of FIG. 8, during the time interval after the moment t34, the condition-indicating value CT3 related to the threshold level Vth3 decreases at the constant rate. The condition-indicating value CT3 drops to "0" at a moment t36 preceding the moment t37 but following the moment t35.

As shown in the portion (A) of FIG. 8, the level of the input analog signal Si(t) decreases across the negative threshold level −Vth3 at the moment t37. The level of the input analog signal Si(t) remains lower than the negative threshold level −Vth3 during the time interval from the moment t37 to a moment t40. Accordingly, as shown in the portion (C) of FIG. 8, during the time interval between the moments t37 and t40, the condition-indicating value CT3 related to the threshold level Vth3 increases from "0" at a rate depending on the related difference |D1(i)|−|Vth3|.

As shown in the portion (A) of FIG. 8, the level of the input analog signal Si(t) decreases across the negative threshold level −Vth2 at the moment t38 following the moment t37 but preceding the moment t40. The level of the input analog signal Si(t) remains lower than the negative threshold level −Vth2 during the time interval from the moment t38 to a moment t39 preceding the moment t40. Accordingly, as shown in the portion (B) of FIG. 8, during the time interval between the moments t38 and t39, the condition-indicating value CT2 related to the threshold level Vth2 increases from "0" at a rate depending on the related difference |D1(i)|−|Vth2|.

As shown in the portion (A) of FIG. 8, the level of the input analog signal Si(t) increases across the negative threshold value −Vth2 at the moment t39. After the moment t39, the level of the input analog signal Si(t) remains higher than the negative threshold level −Vth2 and lower than the positive threshold level Vth2. Thus, as shown in the portion (B) of FIG. 8, during the time interval after the moment t39, the condition-indicating value CT2 related to the threshold level Vth2 decreases at a constant rate. The condition-indicating value CT2 drops to "0" at a moment t41 following the moment t40.

As shown in the portion (A) of FIG. 8, the level of the input analog signal Si(t) increases across the negative threshold value −Vth3 at the moment t40. After the moment t40, the level of the input analog signal Si(t) remains higher than the negative threshold level −Vth3 and lower than the positive threshold level Vth3. Thus, as shown in the portion (C) of FIG. 8, during the time interval after the moment t40, the condition-indicating value CT3 related to the threshold level Vth3 decreases at the constant rate. The condition-indicating value CT3 drops to "0" at a moment t42 following the moment t41.

Third Embodiment

Figure 9:
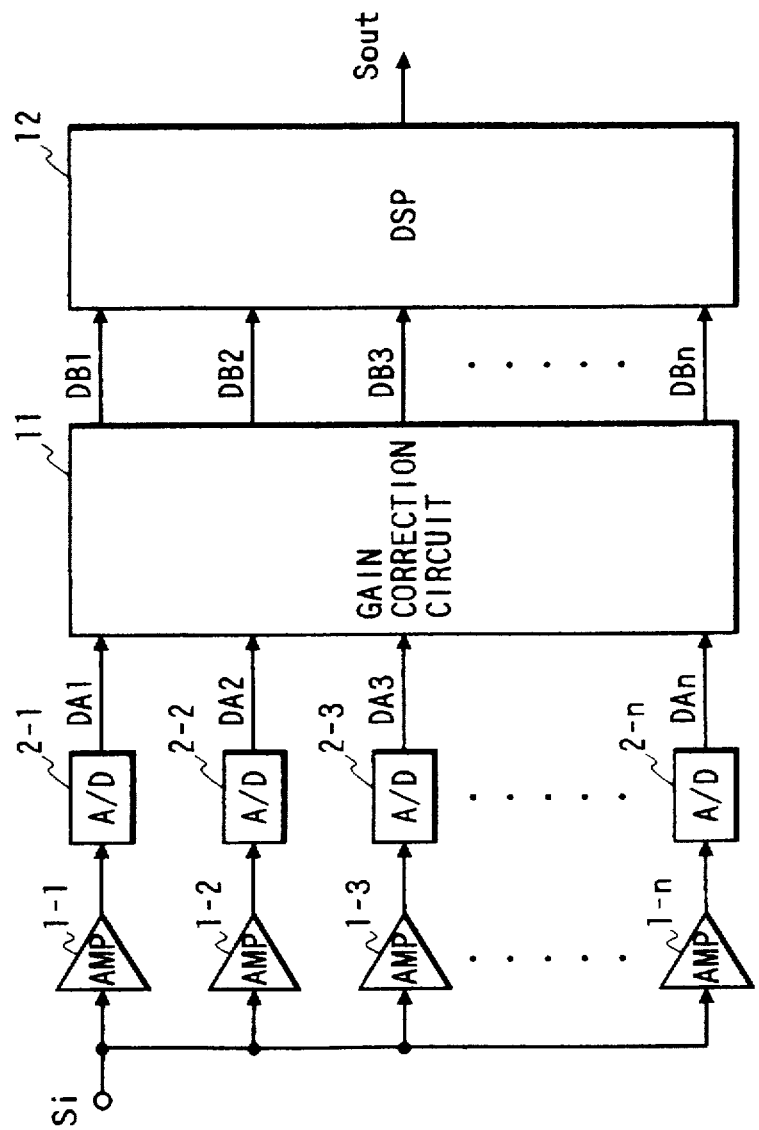
FIG. 9 is a block diagram of an analog-to-digital (A/D) conversion apparatus according to a third embodiment of this invention.

With reference to FIG. 9, an analog-to-digital (A/D) conversion apparatus includes "n" amplifiers 1-1, 1-2, ..., 1-n receiving an input analog signal Si via an apparatus input terminal. Here, "n" denotes a predetermined natural number equal to or greater than 2. The amplifiers 1-1, 1-2, ..., 1-n have predetermined gains A1, A2, ..., An, respectively. The gains A1, A2, ..., An are different from each other. The gains A1, A2, ..., An have a given relation as A1>A2>...>An. The amplifiers 1-1, 1-2, ..., 1-n are followed by analog-to-digital (A/D) converters 2-1, 2-2, ..., 2-n, respectively.

The output terminals of the A/D converters 2-1, 2-2, ..., 2-n are connected to a gain correction circuit 11 followed by a digital signal processor (a DSP) 12. The digital signal processor 12 may be replaced by a microprocessor, a CPU, or a similar device.

The amplifiers 1-1, 1-2, ..., 1-n enlarge the input analog signal Si with the gains A1, A2, ..., An respectively. The amplifiers 1-1, 1-2, ..., 1-n output the resultant analog signals to the A/D converters 2-1, 2-2, ..., 2-n respectively. The A/D converters 2-1, 2-2, ..., 2-n periodically sample the output analog signals of the amplifiers 1-1, 1-2, ..., 1-n, and periodically quantize the resultant samples of the output analog signals of the amplifiers 1-1, 1-2, ..., 1-n into corresponding digital data samples DA1, DA2, ..., DAn respectively. The A/D converters 2-1, 2-2, ..., 2-n output the digital data samples DA1, DA2, ..., DAn to the gain correction circuit 11.

The gain correction circuit 11 serves to compensate for a variation among the gains A1, A2, ..., An. Specifically, the gain correction circuit 11 generates a reference signal in response to one of the digital data samples DA1, DA2, ..., DAn. For example, the gain correction circuit 11 uses the digital data sample DAn as the reference signal. The reference signal is chosen or designed in relation to a desired level of a final output digital signal Sout. The gain correction circuit 11 includes dividers which calculate ratios (level ratios) C1, C2, ..., Cn between the reference signal and the digital data samples DA1, DA2, ..., DAn. The calculated level ratios C1C2, ..., Cn correspond to level adjustment coefficients respectively. The gain correction circuit 11 includes multipliers which generate digital data samples C1·DA1, C2·DA2, ..., Cn·DAn by multiplying the level adjustment coefficients C1, C2, ..., Cn and the digital data samples DA1, DA2, ..., DAn. Hereinafter, the digital data samples C1·DA1, C2·DA2, ..., Cn·DAn will also be denoted by DB1, DB2, ..., DBn respectively. In this way, the gain correction circuit 11 subjects the digital data samples DA1, DA2, ..., DAn to level correction processes in response to the level adjustment coefficients C1, C2, ..., Cn respectively. Thus, the levels represented by the correction-resultant digital data samples DB1, DB2, ..., DBn are substantially equal to each other. The gain correction circuit 11 outputs the digital data samples DB1, DB2, ..., DBn to the digital signal processor 12.

The digital signal processor 12 generates a time segment (a sample) of a final digital signal Sout in response to the digital data samples DB1, DB2, ..., DBn. The digital signal processor 12 outputs the time segment of the final digital signal Sout as an indication of the result of analog-to-digital conversion of the sample of the input analog signal Si.

The amplifiers 1-1, 1-2, ..., 1-n provide given clipping levels with respect to signals inputted thereto, respectively. The A/D converters 2-1, 2-2, ..., 2-n provide given full-scale over levels with respect to signals inputted thereto, respectively.

Figure 10:
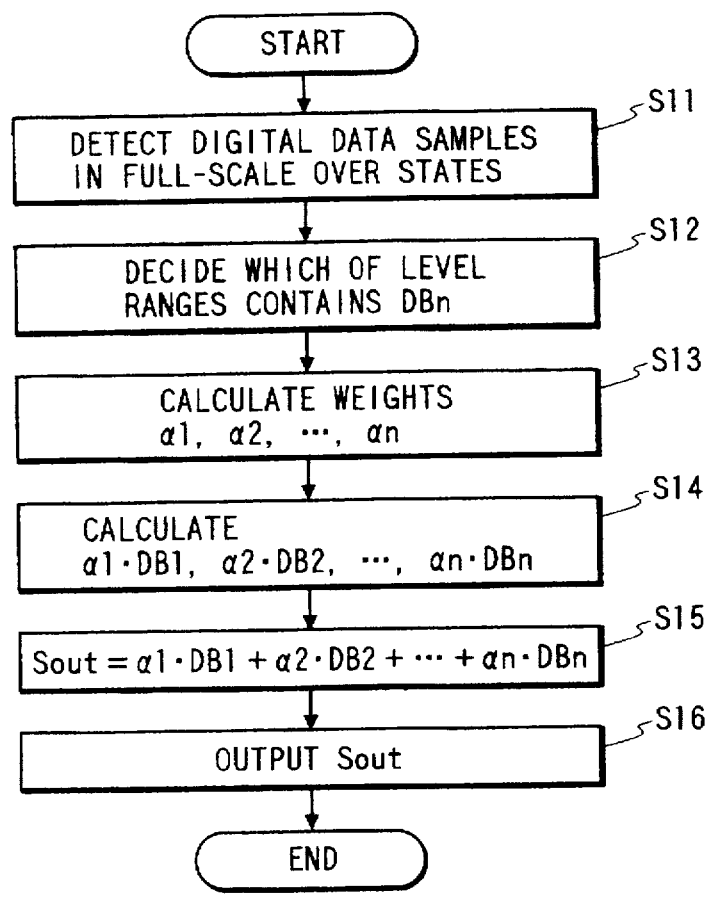
FIG. 10 is a flowchart of a segment of a program for controlling a digital signal processor in FIG. 9.

The digital signal processor 12 includes a combination of an input/output port (an interface), a processing section, a RAM, and a ROM. The digital signal processor 12 operates in accordance with a program stored in the ROM. FIG. 10 is a flowchart of a segment of the program which is executed for every sampling period related to the operation of the A/D converters 2-1, 2-2, ..., 2-n.

As shown in FIG. 10, a first step S11 of the program segment detects the level represented by the digital data sample DBn. The detected level is also denoted by DBn. The step S11 calculates differences |DBn|−|Vth1|, |DBn|−|Vth2|, ..., |DBn|−|Vthn| between the absolute value of the digital data level DBn and the absolute values of predetermined threshold levels Vth1, Vth2, ..., Vthn. The digital data level DBn is used as an indication of the level of the input analog signal Si. The predetermined threshold levels Vth1, Vth2, ..., Vthn correspond to the clipping levels related to the amplifiers 1-1, 1-2, ..., 1-n or the full-scale over levels related to the A/D converters 2-1, 2-2, ..., 2-n, respectively. For example, the predetermined threshold levels Vth1, Vth2, ..., Vthn are slightly lower than the clipping levels related to the amplifiers 1-1, 1-2, ..., 1-n or the full-scale over levels related to the A/D converters 2-1, 2-2, ..., 2-n, respectively. The step S11 decides whether or not the calculated differences |DBn|−|Vth1|, |DBn|−|Vth2|, ..., |DBn|−|Vthn| are positive, that is, whether or not the digital data samples DA1, DA2, ..., DAn are in the clipped states (or the full-scale over states). Accordingly, the step S11 detects digital data samples among the digital data samples DB1, DB2, ..., DBn which relate to the clipped states (or the full-scale over states). Furthermore, the step S11 separates the digital data samples DB1, DB2, ..., DBn into a groups of digital data samples related to the clipped states (or the full-scale over states) and a group of digital data samples unrelated to the clipped states (or the full-scale over states).

A step S12 following the step S11 uses at least one of predetermined different reference levels by which separate level ranges are defined. The step S12 compares the digital data level DBn with at least one of the reference levels to decide which of the level ranges contains the digital data level DBn.

A step S13 subsequent to the step S12 calculates weights α1, α2, ..., αn assigned to the digital data samples DB1, DB2, ..., DBn respectively. Specifically, the step S13 sets weights to "0" which are assigned to the digital data samples related to the clipped states (or the full-scale over states). The step S13 determines the remaining weights in accordance with which of the level ranges contains the digital data level DBn. The sum of the determined weights α1, α2, ..., αn is equal to "1".

A step S14 following the step S13 multiplies the digital data samples DB1, DB2, ..., DBn by the weights α1, α2, ..., αn respectively, and thereby generates digital data pieces α1·DB1, α2·DB2, ..., αn·DBn. A step S15 subsequent to the step S14 adds and combines the digital data pieces α1·DB1, α2·DB2, ..., αn·DBn into a sample (a time segment) of the final digital signal Sout. Thus, the sample of the final digital signal Sout is expressed as Sout=α1·DB1+α2·DB2+...+αn·DBn. A step S16 following the step S15 outputs the sample of the final digital signal Sout. After the step S16, the current execution cycle of the program segment ends.

Fourth Embodiment

Figure 11:
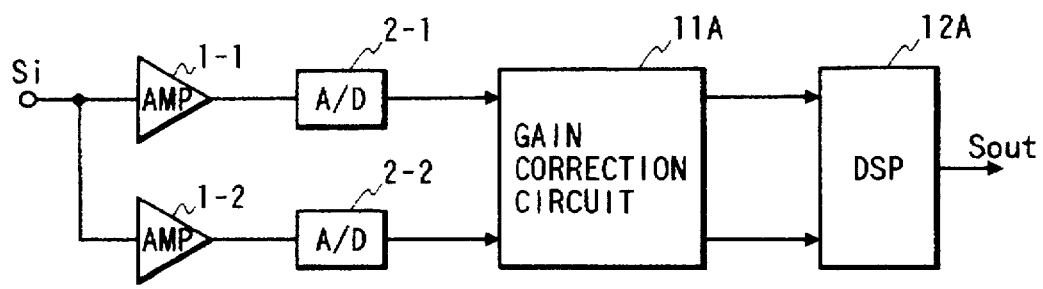
FIG. 11 is a block diagram of an analog-to-digital (A/D) conversion apparatus according to a fourth embodiment of this invention.

With reference to FIG. 11, an analog-to-digital (A/D) conversion apparatus includes amplifiers 1-1 and 1-2 receiving an input analog signal Si via an apparatus input terminal. The amplifiers 1-1 and 1-2 have predetermined gains A1 and A2, respectively. The gains A1 and A2 have a given relation as A1>A2. In other words, the gain A1 is higher than the gain A2. The amplifiers 1-1 and 1-2 are followed by analog-to-digital (A/D) converters 2-1 and 2-2, respectively. The output terminals of the A/D converters 2-1 and 2-2 are connected to a gain correction circuit 11A followed by a digital signal processor (a DSP) 12A. The digital signal processor 12A may be replaced by a microprocessor, a CPU, or a similar device.

The amplifiers 1-1 and 1-2 enlarge the input analog signal Si with the gains A1 and A2, respectively. The amplifiers 1-1 and 1-2 output the resultant analog signals to the A/D converters 2-1 and 2-2, respectively. The A/D converters 2-1 and 2-2 periodically sample the output analog signals of the amplifiers 1-1 and 1-2, and periodically quantize the resultant samples of the output analog signals of the amplifiers 1-1 and 1-2 into corresponding digital data samples DA1 and DA2 respectively. The A/D converters 2-1 and 2-2 output the digital data samples DA1 and DA2 to the gain correction circuit 11A.

The gain correction circuit 11A compensates for a difference between the gains A1 and A2. Specifically, the gain correction circuit 11A generates a reference signal in response to one of the digital data samples DA1 and DA2. For example, the gain correction circuit 11A uses the digital data sample DA2 as the reference signal. The reference signal is chosen or designed in relation to a desired level of a final output digital signal Sout. The gain correction circuit 11A includes dividers which calculate ratios (level ratios) C1 and C2 between the reference signal and the digital data samples DA1 and DA2. The calculated level ratios C1 and C2 correspond to level adjustment coefficients, respectively. The gain correction circuit 11A includes multipliers which generate digital data samples C1·DA1 and C2·DA2 by multiplying the level adjustment coefficients C1 and C2 and the digital data samples DA1 and DA2. Hereinafter, the digital data samples C1·DA1 and C2·DA2 will also be denoted by DB1 and DB2, respectively. In this way, the gain correction circuit 11A subjects the digital data samples DA1 and DA2 to level correction processes in response to the level adjustment coefficients C1 and C2, respectively. Thus, the levels represented by the correction-resultant digital data samples DB1 and DB2 are substantially equal to each other. The gain correction circuit 11A outputs the digital data samples DB1 and DB2 to the digital signal processor 12A.

The digital signal processor 12A generates a time segment (a sample) of a final digital signal Sout in response to the digital data samples DB1 and DB2. The digital signal processor 12A outputs the time segment of the final digital signal Sout as an indication of the result of analog-to-digital conversion of the sample of the input analog signal Si.

The amplifiers 1-1 and 1-2 provide given clipping levels with respect to signals inputted thereto, respectively. The A/D converters 2-1 and 2-2 provide given full-scale over levels with respect to signals inputted thereto, respectively.

Figure 12:
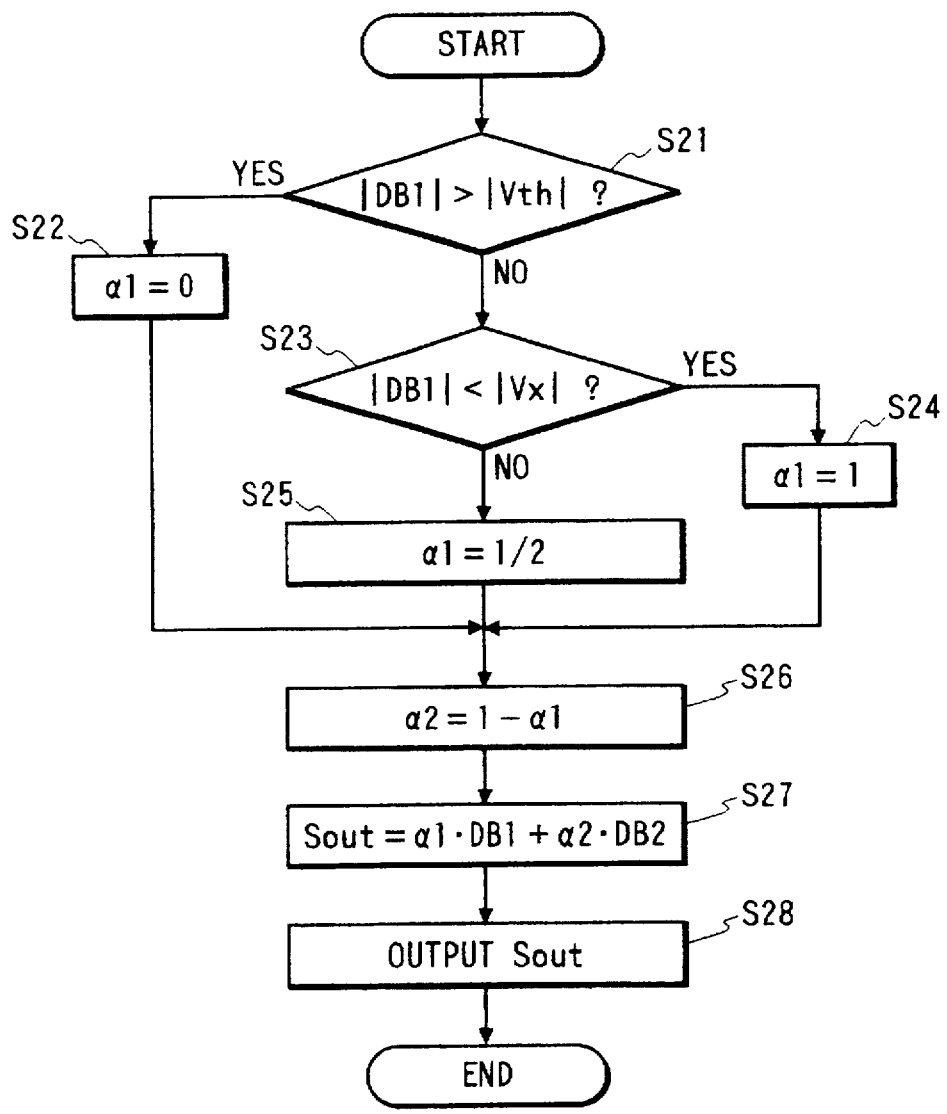
FIG. 12 is a flowchart of a segment of a program for controlling a digital signal processor in FIG. 11.

The digital signal processor 12A includes a combination of an input/output port (an interface), a processing section, a RAM, and a ROM. The digital signal processor 12A operates in accordance with a program stored in the ROM. FIG. 12 is a flowchart of a segment of the program which is executed for every sampling period related to the operation of the A/D converters 2-1 and 2-2.

As shown in FIG. 12, a first step S21 of the program segment detects the level represented by the digital data sample DB1. The detected level is also denoted by DB1. The digital data level DB1 is used as an indication of the level of the input analog signal Si. Alternatively, the digital data level DB2 may be used as an indication of the level of the input analog signal Si. The step S21 compares the absolute value of the digital data level DB1 with the absolute value of a predetermined threshold level Vth. The predetermined threshold level Vth is slightly smaller than the clipping level related to the amplifier 1-1 or the full-scale over level related to the A/D converter 2-1. When the absolute value of the digital data level DB1 is greater than the absolute value of the predetermined threshold level Vth, the program advances from the step S21 to a step S22. Otherwise, the program advances from the step S21 to a step S23.

The step S22 sets a weight $\alpha 1$ to "0". The weight $\alpha 1$ is assigned to the digital data sample DB1. After the step S22, the program advances to a step S26.

The step S23 compares the absolute value of the digital data level DB1 with the absolute value of a predetermined reference level Vx. The absolute value of the predetermined reference level Vx is smaller than the absolute value of the predetermined threshold level Vth. When the absolute value of the digital data level DB1 is smaller than the absolute value of the predetermined reference level Vx, the program advances from the step S23 to a step S24. Otherwise, the program advances from the step S23 to a step S25.

The step S24 sets the weight $\alpha 1$ to "1". As previously explained, the weight $\alpha 1$ is assigned to the digital data sample DB1. After the step S24, the program advances to the step S26. On the other hand, the step S25 sets the weight $\alpha 1$ to "½", that is, "0.5". After the step S25, the program advances to the step S26.

The step S26 sets a weight $\alpha 2$ to "1–$\alpha 1$". The weight $\alpha 2$ is assigned to the digital data sample DB2. After the step S26, the program advances to a step S27.

The step S27 multiplies the digital data sample DB1 by the weight $\alpha 1$, and thereby generates a digital data piece $\alpha 1 \cdot DB1$. Also, the step S27 multiplies the digital data sample DB2 by the weight $\alpha 2$, and thereby generates a digital data piece $\alpha 2 \cdot DB2$. The step S27 adds and combines the digital data pieces $\alpha 1 \cdot DB1$ and $\alpha 2 \cdot DB2$ into a sample (a time segment) of the final digital signal Sout. Accordingly, the sample of the final digital signal Sout is expressed as Sout=$\alpha 1 \cdot DB1 + \alpha 2 \cdot DB2$. A step S28 following the step S27 outputs the sample of the final digital signal Sout. After the step S28, the current execution cycle of the program segment ends.

Figure 13:
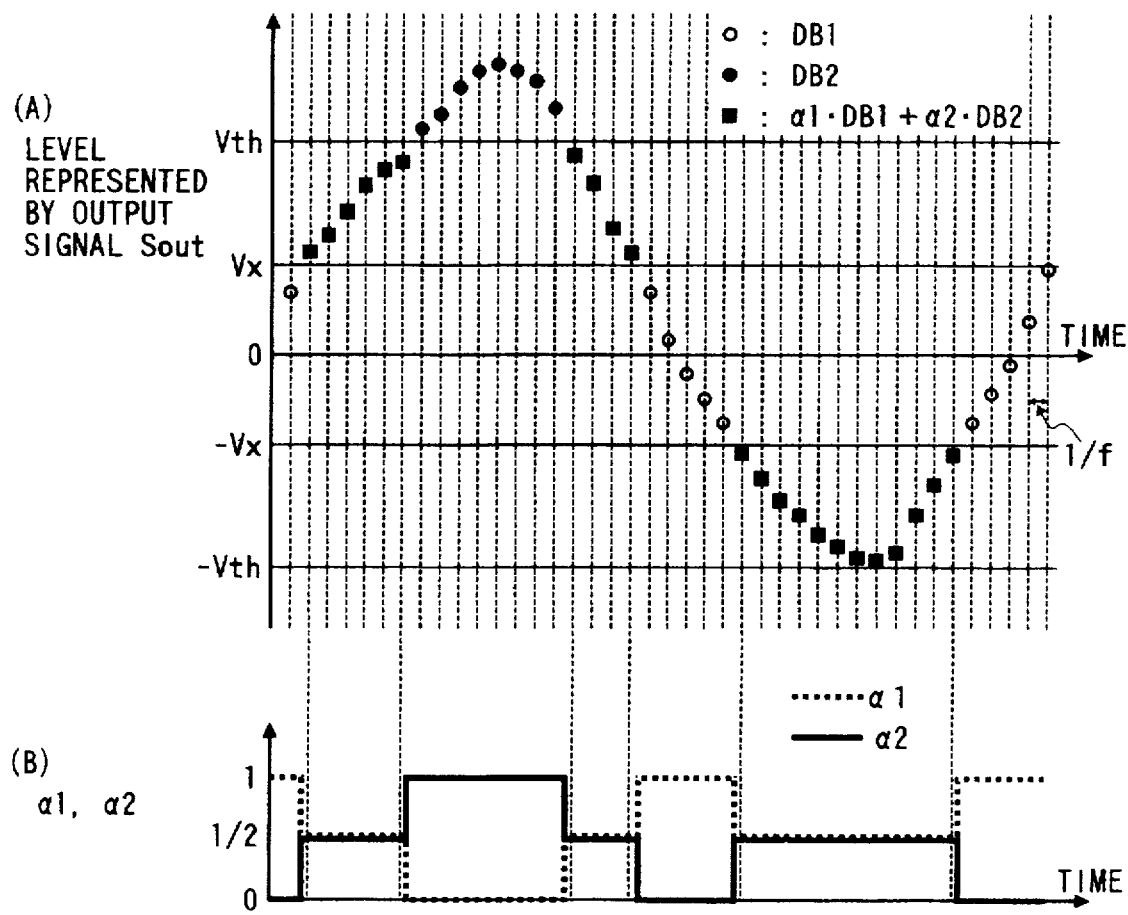
FIG. 13 is a time-domain diagram of a final output digital signal, and weights used in the apparatus of FIG. 11.

FIG. 13 shows an example of time-domain variations in the weights $\alpha 1$ and $\alpha 2$, and the level represented by the final output digital signal Sout. As shown in FIG. 13, when the absolute value of the signal level is smaller than the absolute value of the predetermined reference level Vx, the final output digital signal Sout is formed only by the digital data sample DB1. In this case, the weight $\alpha 1$ is "1" while the weight $\alpha 2$ is "0". When the absolute value of the signal level is between the absolute value of the predetermined reference level Vx and the absolute value of the predetermined threshold level Vth, the final output digital signal Sout is composed of both the digital data samples DB1 and DB2. In this case, both the weights $\alpha 1$ and $\alpha 2$ are "½". When the absolute value of the signal level is greater than the absolute value of the predetermined threshold level Vth, the final output digital signal Sout is formed only by the digital data sample DB2. In this case, the weight $\alpha 1$ is "0" while the weight $\alpha 2$ is "1".

Fifth Embodiment

Figure 14:
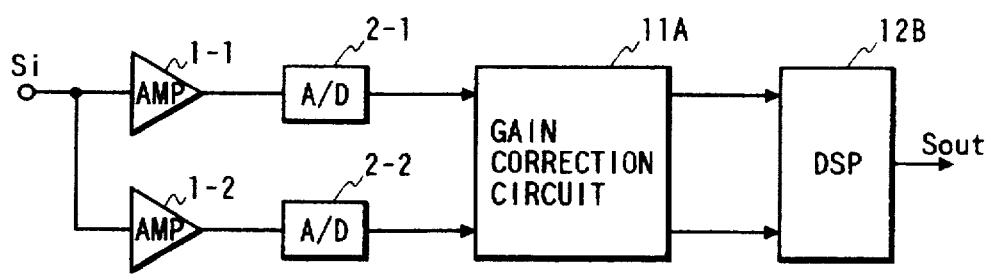
FIG. 14 is a block diagram of an analog-to-digital (A/D) conversion apparatus according to a fifth embodiment of this invention.

FIG. 14 shows an analog-to-digital (A/D) conversion apparatus according to a fifth embodiment of this invention. The A/D conversion apparatus of FIG. 14 is similar to the A/D conversion apparatus of FIG. 11 except that a digital signal processor (a DSP) 12B replaces the digital signal processor 12A (see FIG. 11).

The digital signal processor 12B generates a time segment (a sample) of a final digital signal Sout in response to digital data samples DB1 and DB2 fed from a gain correction circuit 11A. The digital signal processor 12B outputs the time segment of the final digital signal Sout as an indication of the result of analog-to-digital conversion of the sample of an input analog signal Si.

Figure 15:
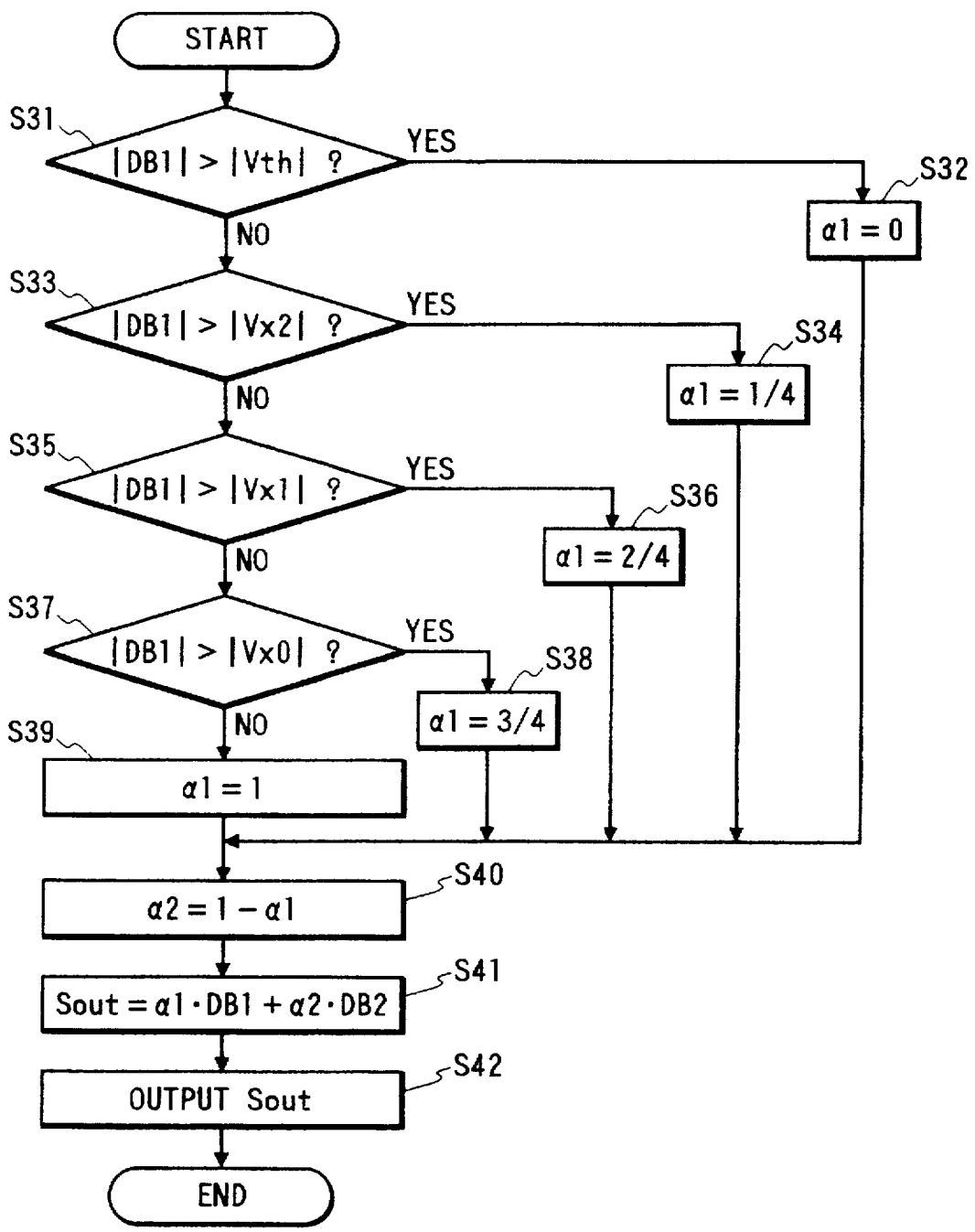
FIG. 15 is a flowchart of a segment of a program for controlling a digital signal processor in FIG. 14.

The digital signal processor 12B includes a combination of an input/output port (an interface), a processing section, a RAM, and a ROM. The digital signal processor 12B operates in accordance with a program stored in the ROM. FIG. 15 is a flowchart of a segment of the program which is executed for every sampling period related to the operation of A/D converters 2-1 and 2-2.

As shown in FIG. 15, a first step S31 of the program segment detects the level represented by the digital data sample DB1. The detected level is also denoted by DB1. The digital data level DB1 is used as an indication of the level of the input analog signal Si. Alternatively, the digital data level DB2 may be used as an indication of the level of the input analog signal Si. The step S31 compares the absolute value of the digital data level DB1 with the absolute value of a predetermined threshold level Vth. The predetermined threshold level Vth is slightly smaller than the clipping level related to an amplifier 1-1 or the full-scale over level related to the A/D converter 2-1. When the absolute value of the digital data level DB1 is greater than the absolute value of the predetermined threshold level Vth, the program advances from the step S31 to a step S32. Otherwise, the program advances from the step S31 to a step S33.

The step S32 sets a weight $\alpha 1$ to "0". The weight $\alpha 1$ is assigned to the digital data sample DB1. After the step S32, the program advances to a step S40.

The step S33 compares the absolute value of the digital data level DB1 with the absolute value of a predetermined reference level Vx2. The absolute value of the predetermined reference level Vx2 is smaller than the absolute value of the predetermined threshold level Vth. When the absolute value of the digital data level DB1 is greater than the absolute value of the predetermined reference level Vx2, the program advances from the step S33 to a step S34. Otherwise, the program advances from the step S33 to a step S35.

The step S34 sets the weight $\alpha 1$ to "¼", that is, "0.25". As previously explained, the weight $\alpha 1$ is assigned to the digital data sample DB1. After the step S34, the program advances to the step S40.

The step S35 compares the absolute value of the digital data level DB1 with the absolute value of a predetermined reference level Vx1. The absolute value of the predetermined reference level Vx1 is smaller than the absolute value of the predetermined reference level Vx2. When the absolute value of the digital data level DB1 is greater than the absolute value of the predetermined reference level Vx2, the program advances from the step S35 to a step S36. Otherwise, the program advances from the step S35 to a step S37.

The step S36 sets the weight $\alpha 1$ to "2/4", that is, "0.5". As previously explained, the weight $\alpha 1$ is assigned to the digital data sample DB1. After the step S36, the program advances to the step S40.

The step S37 compares the absolute value of the digital data level DB1 with the absolute value of a predetermined reference level Vx0. The absolute value of the predetermined reference level Vx0 is smaller than the absolute value of the predetermined reference level Vx1. When the absolute value of the digital data level DB1 is greater than the absolute value of the predetermined reference level Vx0, the program advances from the step S37 to a step S38. Otherwise, the program advances from the step S37 to a step S39.

The step S38 sets the weight α1 to "¾", that is, "0.75". As previously explained, the weight α1 is assigned to the digital data sample DB1. After the step S38, the program advances to the step S40.

The step S39 sets the weight α1 to "1". As previously explained, the weight α1 is assigned to the digital data sample DB1. After the step S39, the program advances to the step S40.

The step S40 sets a weight α2 to "1−α1". The weight α2 is assigned to the digital data sample DB2. After the step S40, the program advances to a step S41.

The step S41 multiplies the digital data sample DB1 by the weight α1, and thereby generates a digital data piece α1·DB1. Also, the step S41 multiplies the digital data sample DB2 by the weight α2, and thereby generates a digital data piece α2·DB2. The step S41 adds and combines the digital data pieces α1·DB1 and α2·DB2 into a sample (a time segment) of the final digital signal Sout. Accordingly, the sample of the final digital signal Sout is expressed as Sout=α1·DB1+α2·DB2. A step S42 following the step S41 outputs the sample of the final digital signal Sout. After the step S42, the current execution cycle of the program segment ends.

Figure 16:
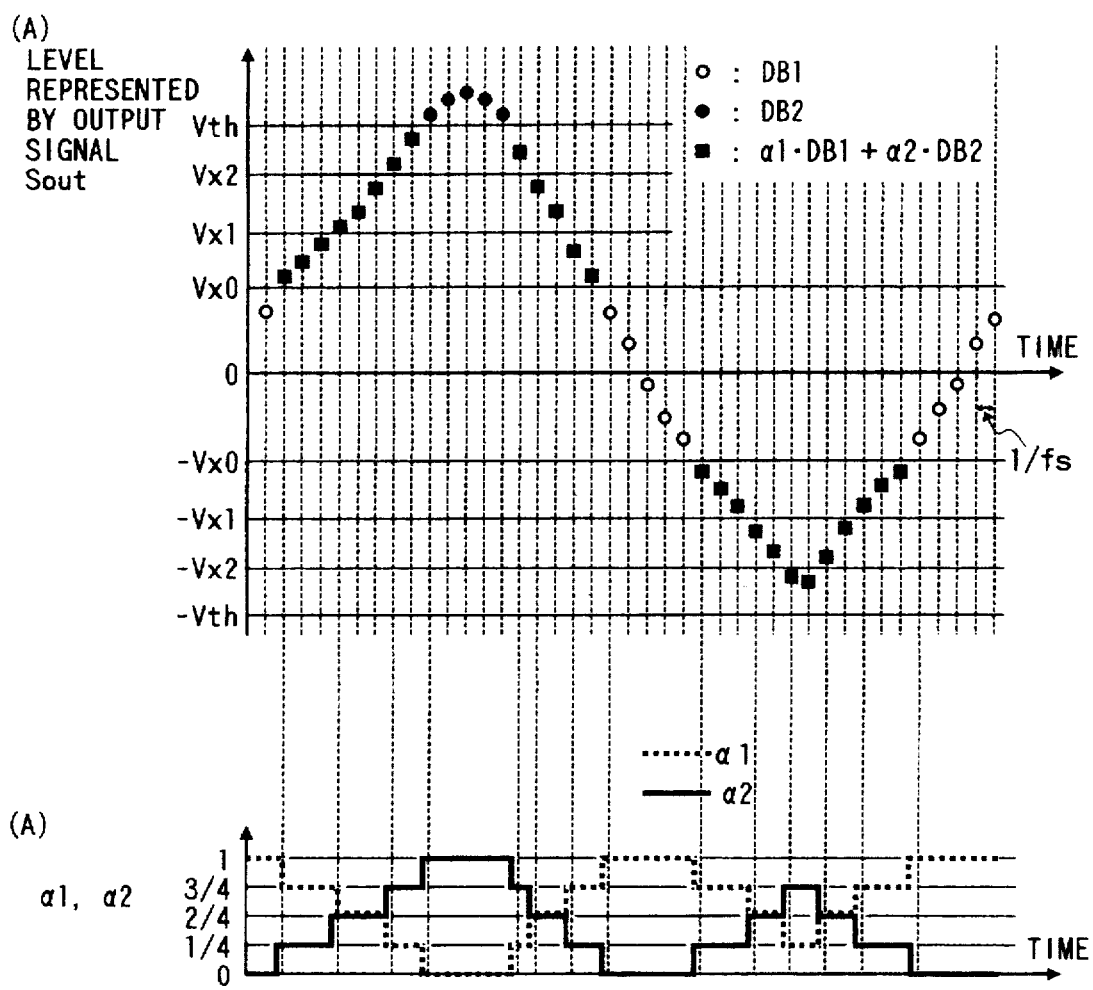
FIG. 16 is a time-domain diagram of a final output digital signal, and weights used in the apparatus of FIG. 14.

FIG. 16 shows an example of time-domain variations in the weights α1 and α2, and the level represented by the final output digital signal Sout. As shown in FIG. 16, when the absolute value of the signal level is smaller than the absolute value of the predetermined reference level Vx0, the final output digital signal Sout is formed only by the digital data sample DB1. In this case, the weight α1 is "1" while the weight α2 is "0".

As shown in FIG. 16, when the absolute value of the signal level is between the absolute value of the predetermined reference level Vx0 and the absolute value of the predetermined threshold level Vth, the final output digital signal Sout is composed of both the digital data samples DB1 and DB2. In this case, the weights α1 and α2 are between "¼" and "¾". Specifically, when the absolute value of the signal level is between the absolute values of the predetermined reference levels Vx0 and Vx1, the weights α1 and α2 are "¾" and "¼" respectively. When the absolute value of the signal level is between the absolute values of the predetermined reference levels Vx1 and Vx2, both the weights α1 and α2 are "½". When the absolute value of the signal level is between the absolute value of the predetermined reference level Vx2 and the absolute value of the predetermined threshold level Vth, the weights α1 and α2 are "¼" and "¾" respectively.

As shown in FIG. 16, when the absolute value of the signal level is greater than the absolute value of the predetermined threshold level Vth, the final output digital signal Sout is formed only by the digital data sample DB2. In this case, the weight α1 is "0" while the weight α2 is "1".

Sixth Embodiment

Figure 17:
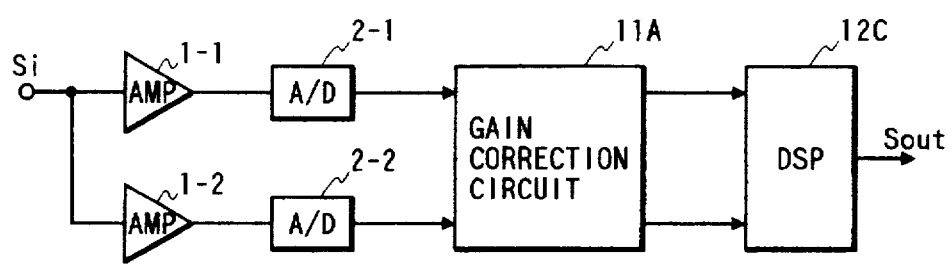
FIG. 17 is a block diagram of an analog-to-digital (A/D) conversion apparatus according to a sixth embodiment of this invention.

FIG. 17 shows an analog-to-digital (A/D) conversion apparatus according to a sixth embodiment of this invention. The A/D conversion apparatus of FIG. 17 is similar to the A/D conversion apparatus of FIG. 11 except that a digital signal processor (a DSP) 12C replaces the digital signal processor 12A (see FIG. 11).

The digital signal processor 12C generates a time segment (a sample) of a final digital signal Sout in response to digital data samples DB1 and DB2 fed from a gain correction circuit 11A. The digital signal processor 12C outputs the time segment of the final digital signal Sout as an indication of the result of analog-to-digital conversion of the sample of an input analog signal Si.

Figure 18:
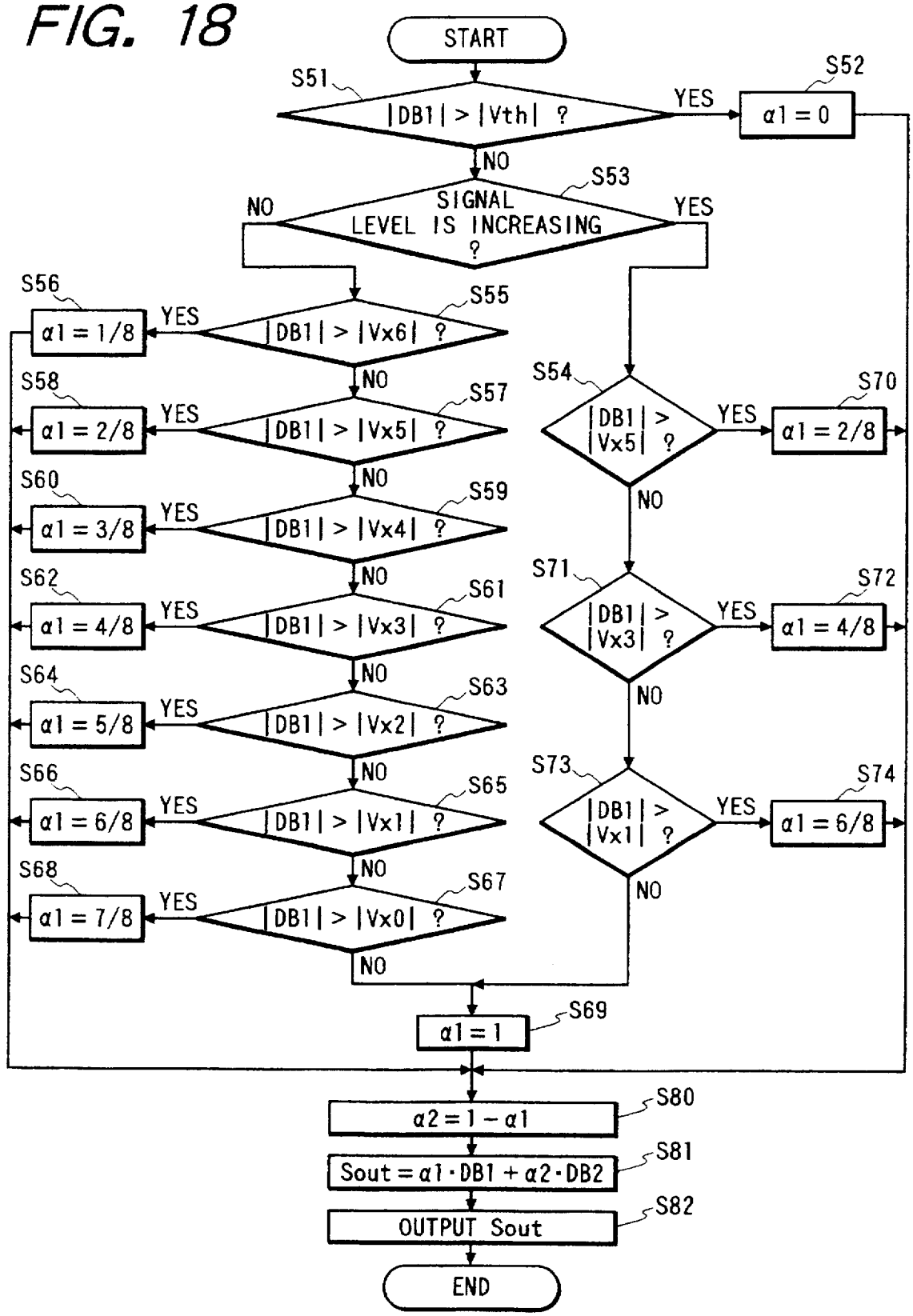
FIG. 18 is a flowchart of a segment of a program for controlling a digital signal processor in FIG. 17.

The digital signal processor 12C includes a combination of an input/output port (an interface), a processing section, a RAM, and a ROM. The digital signal processor 12C operates in accordance with a program stored in the ROM. FIG. 18 is a flowchart of a segment of the program which is executed for every sampling period related to the operation of A/D converters 2-1 and 2-2.

As shown in FIG. 18, a first step S51 of the program segment detects the level represented by the digital data sample DB1. The detected level is also denoted by DB1. The digital data level DB1 is used as an indication of the level of the input analog signal Si. Alternatively, the digital data level DB2 may be used as an indication of the level of the input analog signal Si. The step S51 compares the absolute value of the digital data level DB1 with the absolute value of a predetermined threshold level Vth. The predetermined threshold level Vth is slightly smaller than the clipping level related to an amplifier 1-1 or the full-scale over level related to the A/D converter 2-1. When the absolute value of the digital data level DB1 is greater than the absolute value of the predetermined threshold level Vth, the program advances from the step S51 to a step S52. Otherwise, the program advances from the step S51 to a step S53.

The step S52 sets a weight α1 to "0". The weight α1 is assigned to the digital data sample DB1. After the step S52, the program advances to a step S80.

The step S53 compares the current digital data level DB1 with the immediately-preceding digital data level DB1 to decide whether or not the digital data level DB1 is increasing. It should be noted that the immediately-preceding digital data level DB1 is available during the execution cycle of the program segment which immediately precedes the present execution cycle thereof. When the digital data level DB1 is increasing, the program advances from the step S53 to a step S54. Otherwise, the program advances from the step S53 to a step S55.

The step S55 compares the absolute value of the digital data level DB1 with the absolute value of a predetermined reference level Vx6. The absolute value of the predetermined reference level Vx6 is smaller than the absolute value of the predetermined threshold level Vth. When the absolute value of the digital data level DB1 is greater than the absolute value of the predetermined reference level Vx6, the program advances from the step S55 to a step S56. Otherwise, the program advances from the step S55 to a step S57.

The step S56 sets the weight α1 to "⅛". As previously explained, the weight α1 is assigned to the digital data sample DB1. After the step S56, the program advances to the step S80.

The step S57 compares the absolute value of the digital data level DB1 with the absolute value of a predetermined reference level Vx5. The absolute value of the predetermined reference level Vx5 is smaller than the absolute value of the predetermined reference level Vx6. When the absolute value of the digital data level DB1 is greater than the absolute value of the predetermined reference level Vx5, the program advances from the step S57 to a step S58. Otherwise, the program advances from the step S57 to a step S59.

The step S58 sets the weight α1 to "⅜". As previously explained, the weight α1 is assigned to the digital data sample DB1. After the step S58, the program advances to the step S80.

The step S59 compares the absolute value of the digital data level DB1 with the absolute value of a predetermined reference level Vx4. The absolute value of the predetermined reference level Vx4 is smaller than the absolute value of the predetermined reference level Vx5. When the absolute value of the digital data level DB1 is greater than the absolute value of the predetermined reference level Vx4, the program advances from the step S59 to a step S60. Otherwise, the program advances from the step S59 to a step S61.

The step S60 sets the weight α1 to "⅜". As previously explained, the weight α1 is assigned to the digital data sample DB1. After the step S60, the program advances to the step S80.

The step S61 compares the absolute value of the digital data level DB1 with the absolute value of a predetermined reference level Vx3. The absolute value of the predetermined reference level Vx3 is smaller than the absolute value of the predetermined reference level Vx4. When the absolute value of the digital data level DB1 is greater than the absolute value of the predetermined reference level Vx3, the program advances from the step S61 to a step S62. Otherwise, the program advances from the step S61 to a step S63.

The step S62 sets the weight α1 to "⅜". As previously explained, the weight α1 is assigned to the digital data sample DB1. After the step S62, the program advances to the step S80.

The step S63 compares the absolute value of the digital data level DB1 with the absolute value of a predetermined reference level Vx2. The absolute value of the predetermined reference level Vx2 is smaller than the absolute value of the predetermined reference level Vx3. When the absolute value of the digital data level DB1 is greater than the absolute value of the predetermined reference level Vx2, the program advances from the step S63 to a step S64. Otherwise, the program advances from the step S63 to a step S65.

The step S64 sets the weight α1 to "⅝". As previously explained, the weight α1 is assigned to the digital data sample DB1. After the step S64, the program advances to the step S80.

The step S65 compares the absolute value of the digital data level DB1 with the absolute value of a predetermined reference level Vx1. The absolute value of the predetermined reference level Vx1 is smaller than the absolute value of the predetermined reference level Vx2. When the absolute value of the digital data level DB1 Is greater than the absolute value of the predetermined reference level Vx1, the program advances from the step S65 to a step S66. Otherwise, the program advances from the step S65 to a step S67.

The step S66 sets the weight α1 to "⅝". As previously explained, the weight α1 is assigned to the digital data sample DB1. After the step S66, the program advances to the step S80.

The step S67 compares the absolute value of the digital data level DB1 with the absolute value of a predetermined reference level Vx0. The absolute value of the predetermined reference level Vx0 is smaller than the absolute value of the predetermined reference level Vx1. When the absolute value of the digital data level DB1 is greater than the absolute value of the predetermined reference level Vx0, the program advances from the step S67 to a step S68. Otherwise, the program advances from the step S67 to a step S69.

The step S68 sets the weight α1 to "⅞". As previously explained, the weight α1 is assigned to the digital data sample DB1. After the step S68, the program advances to the step S80.

The step S54 compares the absolute value of the digital data level DB1 with the absolute value of the predetermined reference level Vx5. When the absolute value of the digital data level DB1 is greater than the absolute value of the predetermined reference level Vx5, the program advances from the step S54 to a step S70. Otherwise, the program advances from the step S54 to a step S71.

The step S70 sets the weight α1 to "⅜". As previously explained, the weight α1 is assigned to the digital data sample DB1. After the step S70, the program advances to the step S80.

The step S71 compares the absolute value of the digital data level DB1 with the absolute value of the predetermined reference level Vx3. When the absolute value of the digital data level DB1 is greater than the absolute value of the predetermined reference level Vx3, the program advances from the step S71 to a step S72. Otherwise, the program advances from the step S71 to a step S73.

The step S72 sets the weight α1 to "⅜". As previously explained, the weight α1 is assigned to the digital data sample DB1. After the step S72, the program advances to the step S80.

The step S73 compares the absolute value of the digital data level DB1 with the absolute value of the predetermined reference level Vx1. When the absolute value of the digital data level DB1 is greater than the absolute value of the predetermined reference level Vx1, the program advances from the step S73 to a step S74. Otherwise, the program advances from the step S73 to the step 69.

The step S74 sets the weight α1 to "⅝". As previously explained, the weight α1 is assigned to the digital data sample DB1. After the step S74, the program advances to the step S80.

The step S69 sets the weight α1 to "1". As previously explained, the weight α1 is assigned to the digital data sample DB1. After the step S69, the program advances to the step S80.

The step S80 sets a weight α2 to "1−α1". The weight α2 is assigned to the digital data sample DB2. After the step S80, the program advances to a step S81.

The step S81 multiplies the digital data sample DB1 by the weight α1, and thereby generates a digital data piece α1·DB1. Also, the step S81 multiplies the digital data sample DB2 by the weight α2, and thereby generates a digital data piece α2·DB2. The step S81 adds and combines the digital data pieces α1·DB1 and α2·DB2 into a sample (a time segment) of the final digital signal Sout. Accordingly, the sample of the final digital signal Sout is expressed as Sout=α1·DB1+α2·DB2. A step S82 following the step S81 outputs the sample of the final digital signal Sout. After the step S82, the current execution cycle of the program segment ends.

Figure 19:
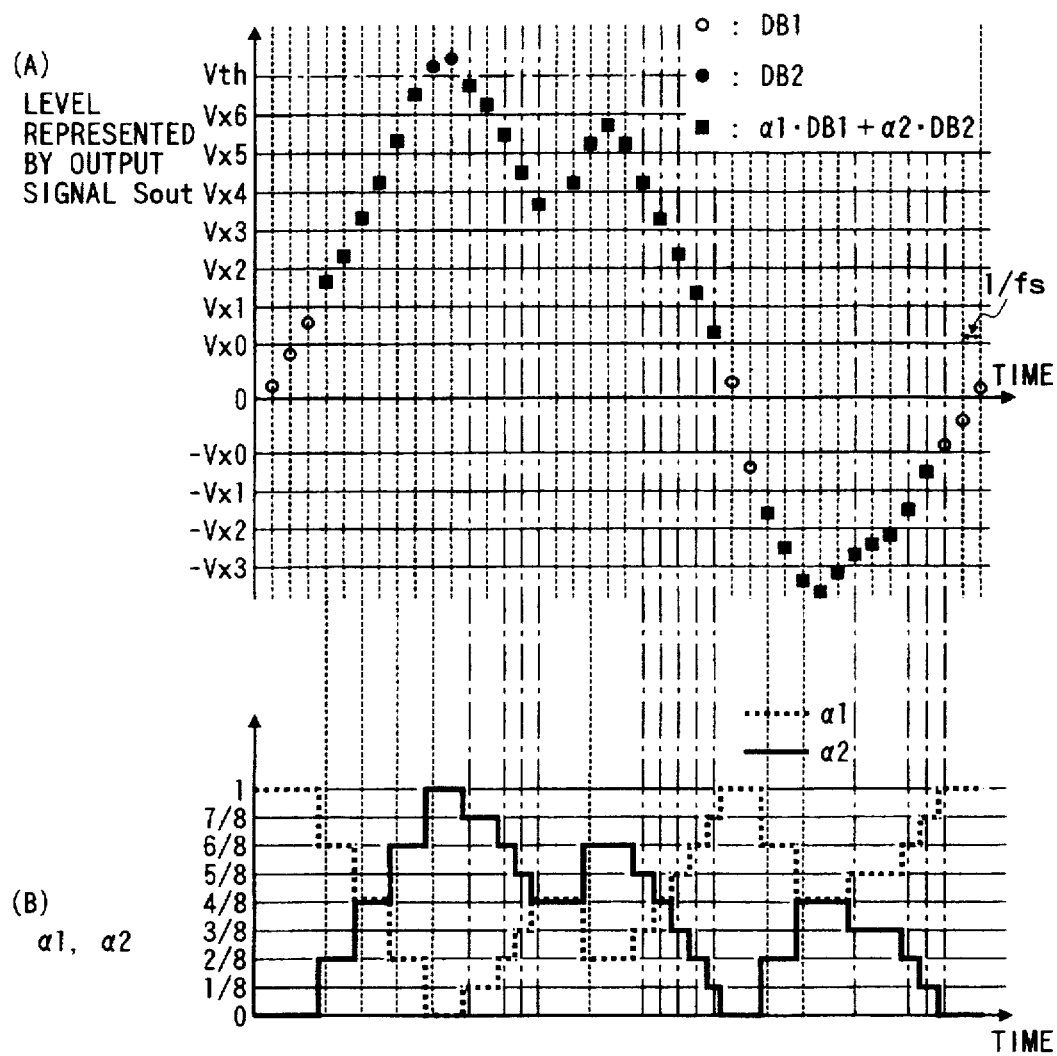
FIG. 19 is a time-domain diagram of a final output digital signal, and weights used in the apparatus of FIG. 17.

FIG. 19 shows an example of time-domain variations in the weights α1 and α2, and the level represented by the final output digital signal Sout. As shown in FIG. 19, when the absolute value of the signal level is smaller than the absolute value of the predetermined reference level Vx0, the final output digital signal Sout is formed only by the digital data sample DB1. In this case, the weight α1 is "1" while the weight α2 is "0".

As shown in FIG. 19, when the absolute value of the signal level is between the absolute value of the predetermined reference level Vx0 and the absolute value of the predetermined threshold level Vth, the final output digital signal Sout is basically composed of both the digital data samples DB1 and DB2. In this case, the weights α1 and α2 are between "⅛" and "⅞". The weights α1 and α2 depend on whether or not the signal level is increasing. Also, the weights α1 and α2 depend on which of separate level ranges defined by the predetermined reference values Vx1–Vx6 contains the signal level.

Specifically, in the case where the signal level is increasing, when the absolute value of the signal level is between the absolute values of the predetermined reference levels Vx1 and Vx3, the weights α1 and α2 are "⅝" and "⅞" respectively. When the absolute value of the signal level is between the absolute values of the predetermined reference levels Vx3 and Vx5, both the weights α1 and α2 are "⅘". When the absolute value of the signal level is between the absolute value of the predetermined reference level Vx5 and the absolute value of the predetermined threshold level Vth, the weights α1 and α2 are "⅞" and "⅝" respectively.

In the case where the signal level is decreasing or constant, when the absolute value of the signal level is between the absolute values of the predetermined reference levels Vx0 and Vx1, the weights α1 and α2 are "⅞" and "⅛" respectively. When the absolute value of the signal level is between the absolute values of the predetermined reference levels Vx1 and Vx2, the weights α1 and α2 are "⅝" and "⅞" respectively. When the absolute value of the signal level is between the absolute values of the predetermined reference levels Vx2 and Vx3, the weights α1 and α2 are "⅝" and "⅞" respectively. When the absolute value of the signal level is between the absolute values of the predetermined reference levels Vx3 and Vx4, both the weights α1 and α2 are "⅘". When the absolute value of the signal level is between the absolute values of the predetermined reference levels Vx4 and Vx5, the weights α1 and α2 are "⅞" and "⅝" respectively. When the absolute value of the signal level is between the absolute values of the predetermined reference levels Vx5 and Vx6, the weights α1 and α2 are "⅞" and "⅝" respectively. When the absolute value of the signal level is between the absolute value of the predetermined reference level Vx6 and the predetermined threshold level Vth, the weights α1 and α2 are "⅛" and "⅞" respectively.

As shown in FIG. 19, when the absolute value of the signal level is greater than the absolute value of the predetermined threshold level Vth, the final output digital signal Sout is formed only by the digital data sample DB2. In this case, the weight α1 is "0" while the weight α2 is "1".

Seventh Embodiment

Figure 20:
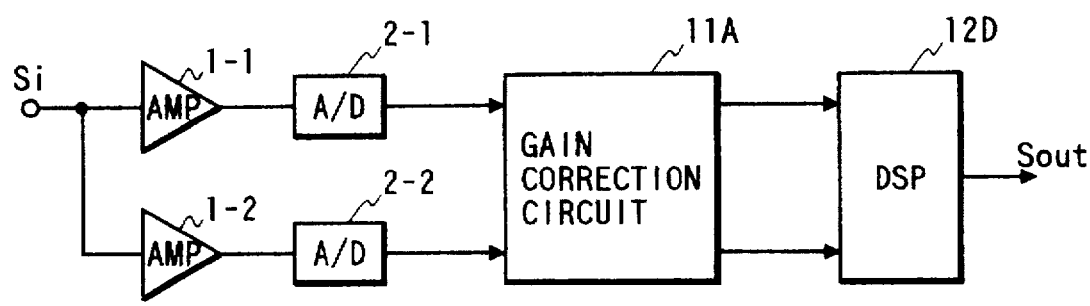
FIG. 20 is a block diagram of an analog-to-digital (A/D) conversion apparatus according to a seventh embodiment of this invention.

FIG. 20 shows an analog-to-digital (A/D) conversion apparatus according to a seventh embodiment of this invention. The A/D conversion apparatus of FIG. 20 is similar to the A/D conversion apparatus of FIG. 11 except that a digital signal processor (a DSP) 12D replaces the digital signal processor 12A (see FIG. 11).

The digital signal processor 12D generates a time segment (a sample) of a final digital signal Sout in response to digital data samples DB1 and DB2 fed from a gain correction circuit 11A. The digital signal processor 12D outputs the time segment of the final digital signal Sout as an indication of the result of analog-to-digital conversion of the sample of an input analog signal Si.

Figure 21:
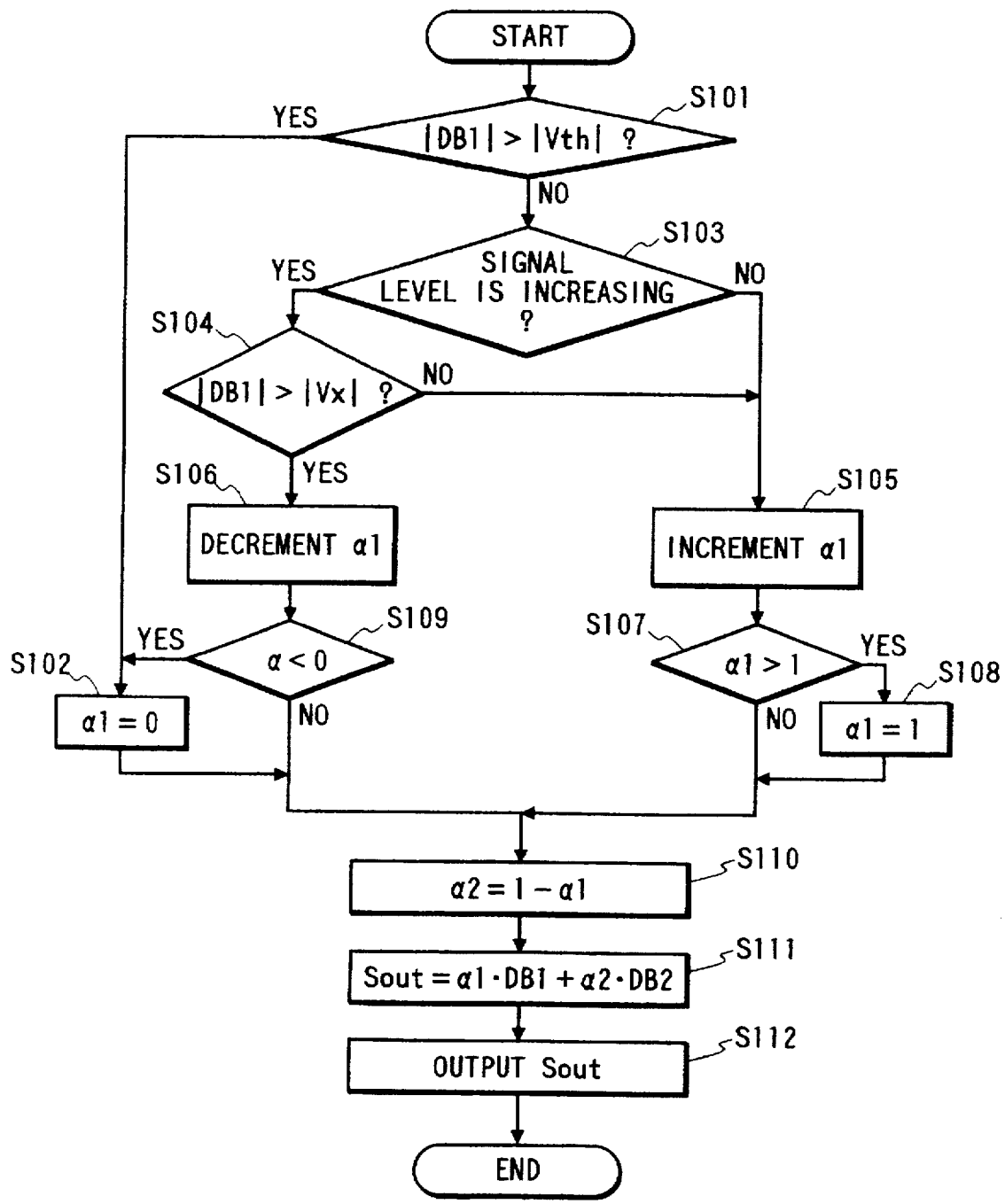
FIG. 21 is a flowchart of a segment of a program for controlling a digital signal processor in FIG. 20.

The digital signal processor 12D includes a combination of an input/output port (an interface), a processing section, a RAM, and a ROM. The digital signal processor 12D operates in accordance with a program stored in the ROM. FIG. 21 is a flowchart of a segment of the program which is executed for every sampling period related to the operation of A/D converters 2-1 and 2-2.

As shown in FIG. 21, a first step S101 of the program segment detects the level represented by the digital data sample DB1. The detected level is also denoted by DB1. The digital data level DB1 is used as an indication of the level of the input analog signal Si.

Alternatively, the digital data level DB2 may be used as an indication of the level of the input analog signal Si. The step S101 compares the absolute value of the digital data level DB1 with the absolute value of a predetermined threshold level Vth. The predetermined threshold level Vth is slightly smaller than the clipping level related to an amplifier 1-1 or the full-scale over level related to the A/D converter 2-1. When the absolute value of the digital data level DB1 is greater than the absolute value of the predetermined threshold level Vth, the program advances from the step S101 to a step S102. Otherwise, the program advances from the step S101 to a step S103.

The step S102 sets a weight α1 to "0". The weight α1 is assigned to the digital data sample DB1. After the step S102, the program advances to a step S110.

The step S103 compares the current digital data level DB1 with the immediately-preceding digital data level DB1 to decide whether or not the digital data level DB1 is increasing. It should be noted that the immediately-preceding digital data level DB1 is available during the execution cycle of the program segment which immediately precedes the present execution cycle thereof. When the digital data level DB1 is increasing, the program advances from the step S103 to a step S104. Otherwise, the program advances from the step S103 to a step S105.

The step S104 compares the absolute value of the digital data level DB1 with the absolute value of a predetermined reference level Vx. The absolute value of the predetermined reference level Vx is smaller than the absolute value of the predetermined threshold level Vth. When the absolute value of the digital data level DB1 is greater than the absolute value of the predetermined reference level Vx, the program advances from the step S104 to a step S106. Otherwise, the program advances from the step S104 to the step S105.

The step S105 increments the weight α1 by a given value equal to, for example, "1/12". After the step S105, the program advances to a step S107.

The step S107 compares the weight α1 with "1". When the weight α1 is greater than "1", the program advances from the step S107 to a step S108. Otherwise, the program advances from the step S107 to a step S110. The step S108 sets the weight α1 to "1". After the step S108, the program advances to the step S110.

The step S106 decrements the weight α1 by a given value equal to, for example, "1/12". After the step S106, the program advances to a step S109.

The step S109 compares the weight α1 with "0". When the weight α1 is smaller than "0", the program advances from the step S109 to the step S102. Otherwise, the program advances from the step S109 to the step S110.

The step S110 sets a weight $\alpha 2$ to "$1-\alpha 1$". The weight $\alpha 2$ is assigned to the digital data sample DB2. After the step S110, the program advances to a step S111.

The step S111 multiplies the digital data sample DB1 by the weight $\alpha 1$, and thereby generates a digital data piece $\alpha 1 \cdot DB1$. Also, the step S111 multiplies the digital data sample DB2 by the weight $\alpha 2$, and thereby generates a digital data piece $\alpha 2 \cdot DB2$. The step S111 adds and combines the digital data pieces $\alpha 1 \cdot DB1$ and $\alpha 2 \cdot DB2$ into a sample (a time segment) of the final digital signal Sout. Accordingly, the sample of the final digital signal Sout is expressed as Sout=$\alpha 1 \cdot DB1 + \alpha 2 \cdot DB2$. A step S112 following the step S111 outputs the sample of the final digital signal Sout. After the step S112, the current execution cycle of the program segment ends.

Figure 22:
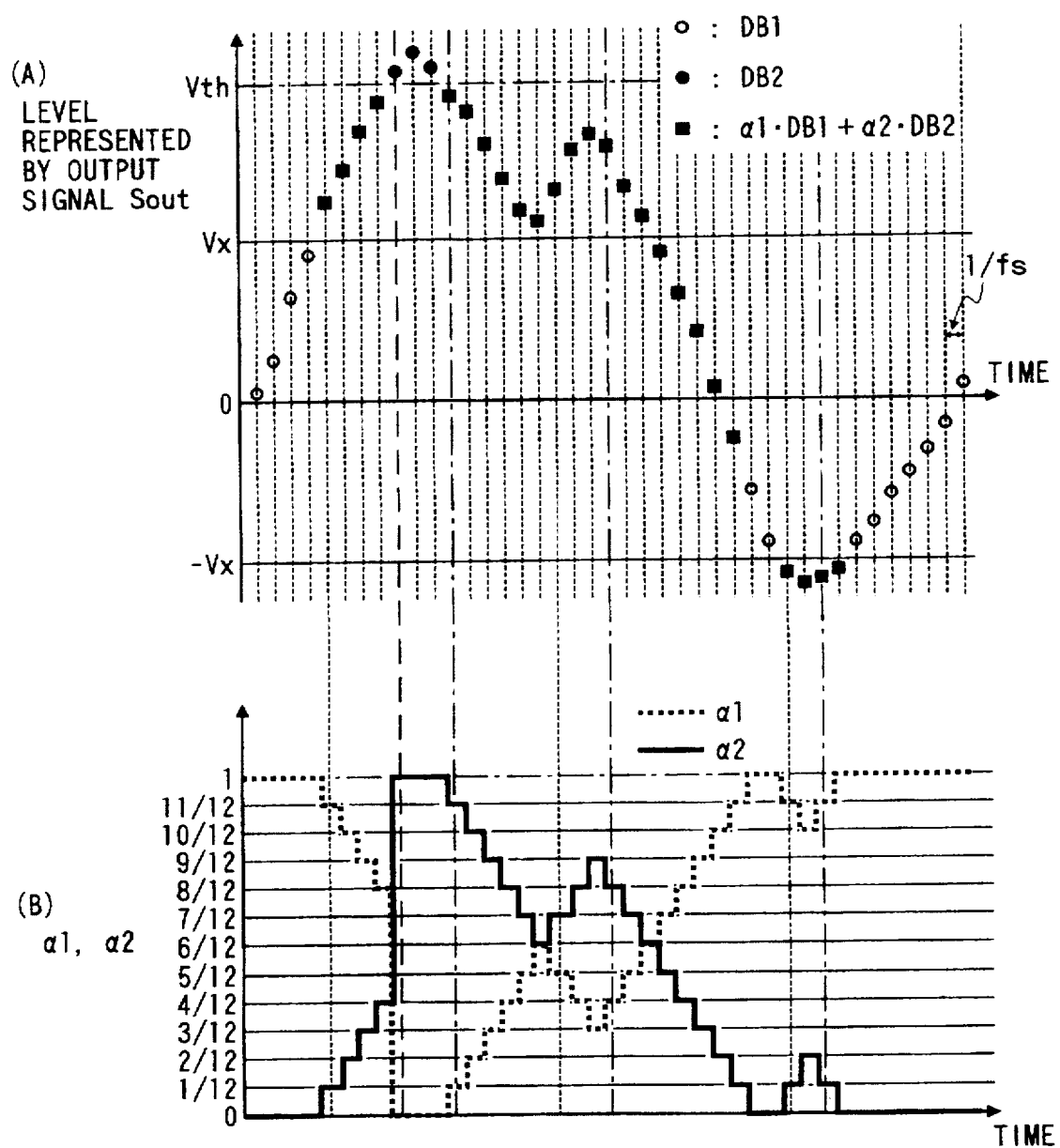
FIG. 22 is a time-domain diagram of a final output digital signal, and weights used in the apparatus of FIG. 20.

FIG. 22 shows an example of time-domain variations in the weights $\alpha 1$ and $\alpha 2$, and the level represented by the final output digital signal Sout. As shown in FIG. 22, in the case where the signal level is increasing, when the absolute value of the signal level is greater than the absolute value of the predetermined reference level Vx, the weights $\alpha 1$ and $\alpha 2$ are decremented and incremented respectively. In this case, each of the weights $\alpha 1$ and $\alpha 2$ is limited to within the range between "0" and "1".

In the case where the signal level is increasing, when the absolute value of the signal level is equal to or smaller than the absolute value of the predetermined reference level Vx, the weights $\alpha 1$ and $\alpha 2$ are incremented and decremented respectively. In this case, each of the weights $\alpha 1$ and $\alpha 2$ is limited to within the range between "0" and "1".

As shown in FIG. 22, in the case where the signal level is decreasing or constant, the weights $\alpha 1$ and $\alpha 2$ are incremented and decremented respectively. In this case, each of the weights $\alpha 1$ and $\alpha 2$ is limited to within the range between "0" and "1".

As shown in FIG. 22, when the absolute value of the signal level is greater than the absolute value of the predetermined threshold level Vth, the final output digital signal Sout is formed only by the digital data sample DB2. In this case, the weight $\alpha 1$ is "0" while the weight $\alpha 2$ is "1".

Eighth Embodiment

Figure 23:
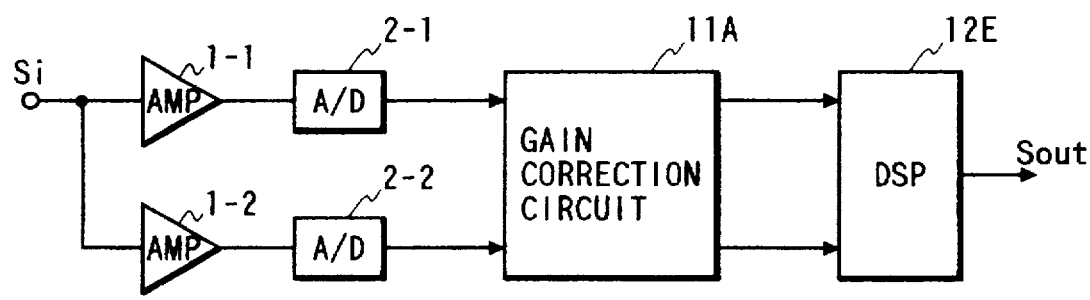
FIG. 23 is a block diagram of an analog-to-digital (A/D) conversion apparatus according to an eighth embodiment of this invention.

FIG. 23 shows an analog-to-digital (A/D) conversion apparatus according to an eighth embodiment of this invention. The A/D conversion apparatus of FIG. 23 is similar to the A/D conversion apparatus of FIG. 20 except that a digital signal processor (a DSP) 12E replaces the digital signal processor 12D (see FIG. 20).

The digital signal processor 12E generates a time segment (a sample) of a final digital signal Sout in response to digital data samples DB1 and DB2 fed from a gain correction circuit 11A. The digital signal processor 12E outputs the time segment of the final digital signal Sout as an indication of the result of analog-to-digital conversion of the sample of an input analog signal Si.

Figure 24:
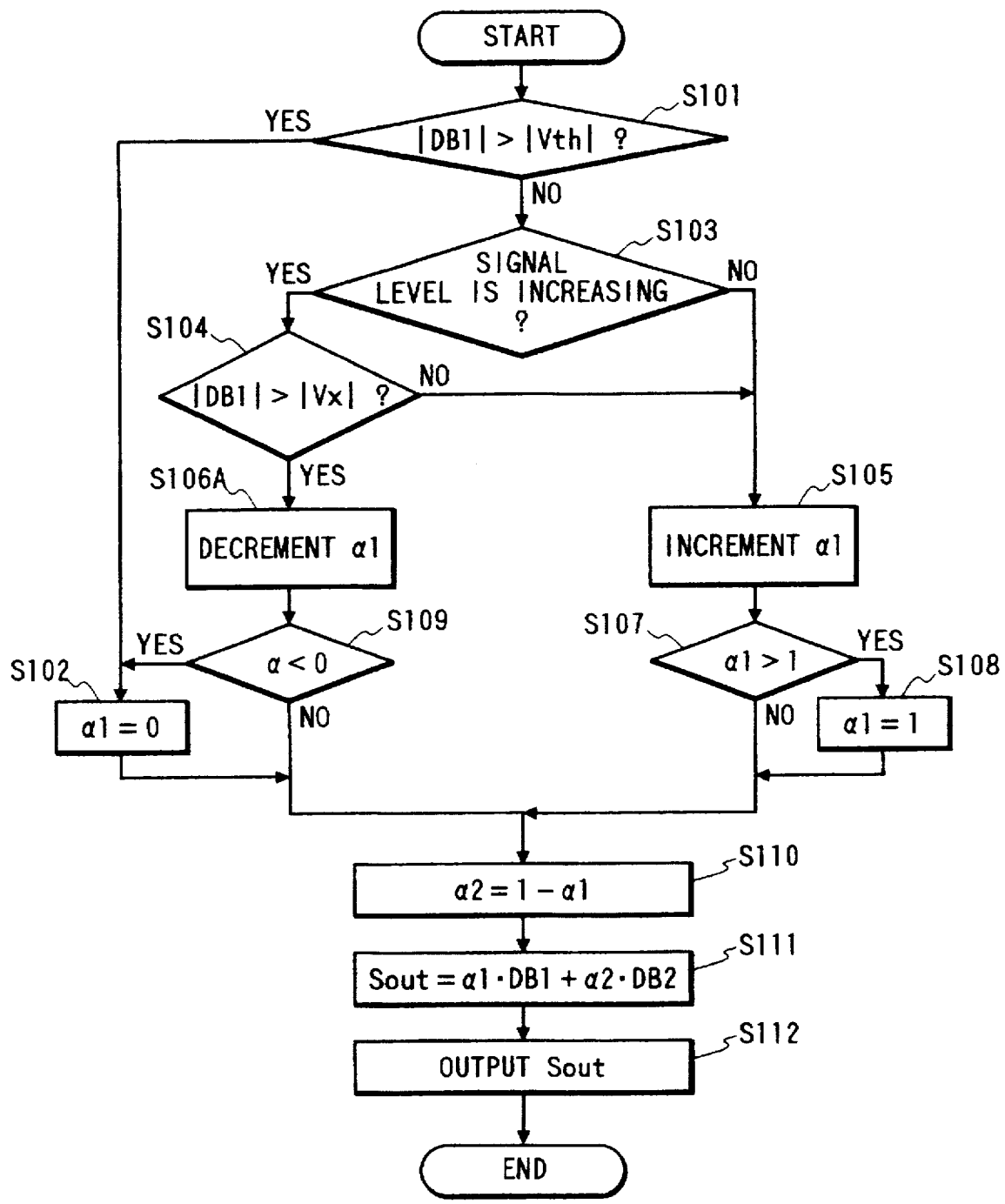
FIG. 24 is a flowchart of a segment of a program for controlling a digital signal processor in FIG. 23.

The digital signal processor 12E includes a combination of an input/output port (an interface), a processing section, a RAM, and a ROM. The digital signal processor 12E operates in accordance with a program stored in the ROM. FIG. 24 is a flowchart of a segment of the program which is executed for every sampling period related to the operation of A/D converters 2-1 and 2-2.

The program segment in FIG. 24 is similar to the program segment in FIG. 21 except that a step S106A replaces the step S106 (see FIG. 21). The step S106A decrements a weight $\alpha 1$ by a given value equal to, for example, "3/12". The given value used by the step S106A is greater than a given value used by a step S105.

Figure 25:
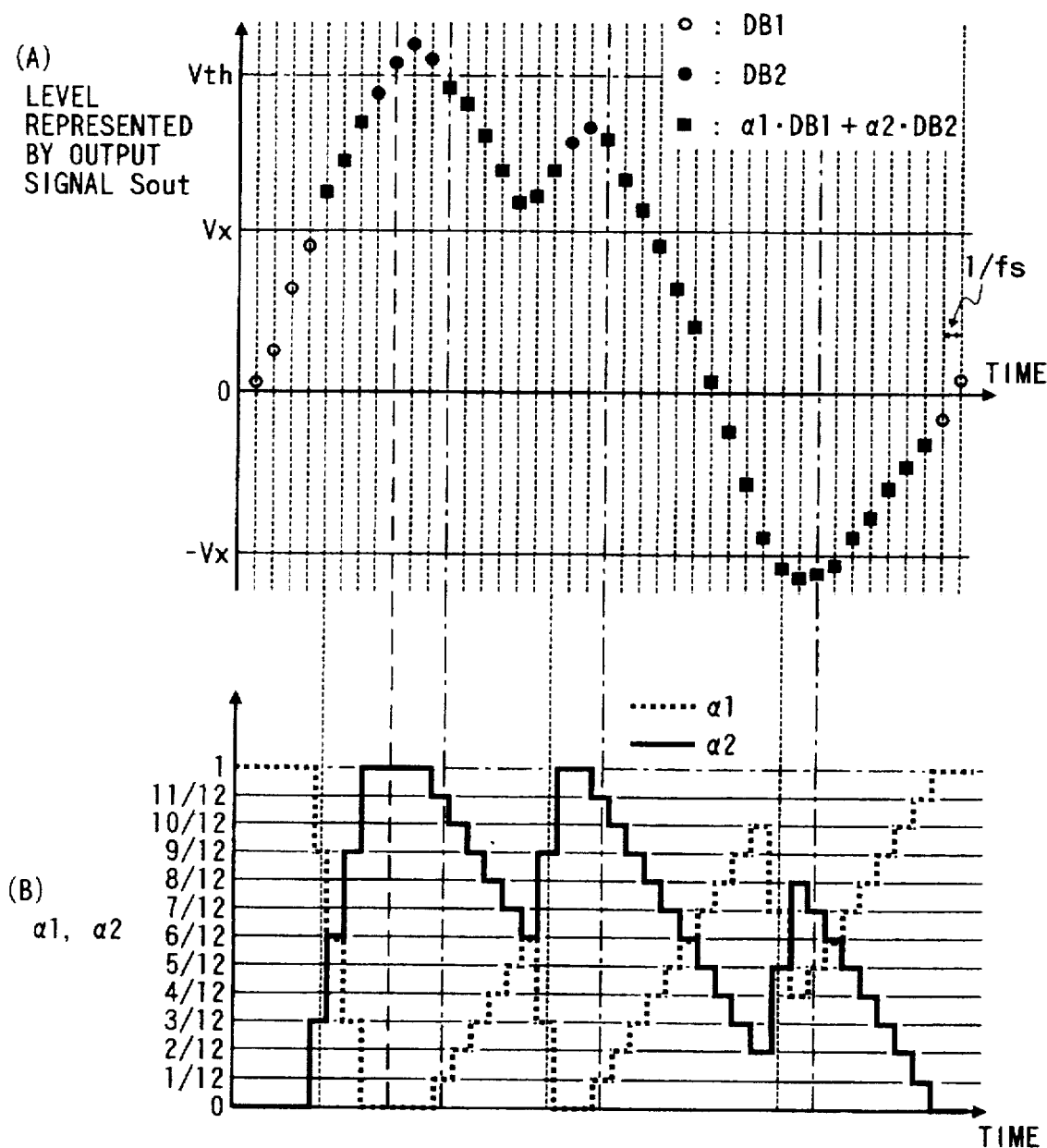
FIG. 25 is a time-domain diagram of a final output digital signal, and weights used in the apparatus of FIG. 23.

FIG. 25 shows an example of time-domain variations in the weights $\alpha 1$ and $\alpha 2$, and the level represented by the final output digital signal Sout. As shown in FIG. 25, in the case where the signal level is increasing, when the absolute value of the signal level is greater than the absolute value of the predetermined reference level Vx, the weights $\alpha 1$ and $\alpha 2$ are decremented and incremented respectively at a greater rate determined by the given value used in the step S106A.

As shown in FIG. 25, in the case where the signal level is decreasing or constant, the weights $\alpha 1$ and $\alpha 2$ are incremented and decremented respectively at a smaller rate determined by the given value used in the step S105.

Ninth Embodiment

Figure 26:
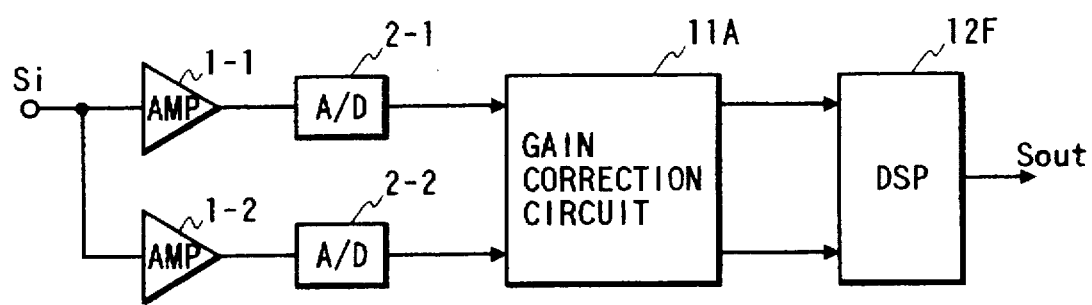
FIG. 26 is a block diagram of an analog-to-digital (A/D) conversion apparatus according to a ninth embodiment of this invention.

FIG. 26 shows an analog-to-digital (A/D) conversion apparatus according to a ninth embodiment of this invention. The A/D conversion apparatus of FIG. 26 is similar to the A/D conversion apparatus of FIG. 11 except that a digital signal processor (a DSP) 12F replaces the digital signal processor 12A (see FIG. 11).

The digital signal processor 12F generates a time segment (a sample) of a final digital signal Sout in response to digital data samples DB1 and DB2 fed from a gain correction circuit 11A. The digital signal processor 12F outputs the time segment of the final digital signal Sout as an indication of the result of analog-to-digital conversion of the sample of an input analog signal Si.

Figure 27:
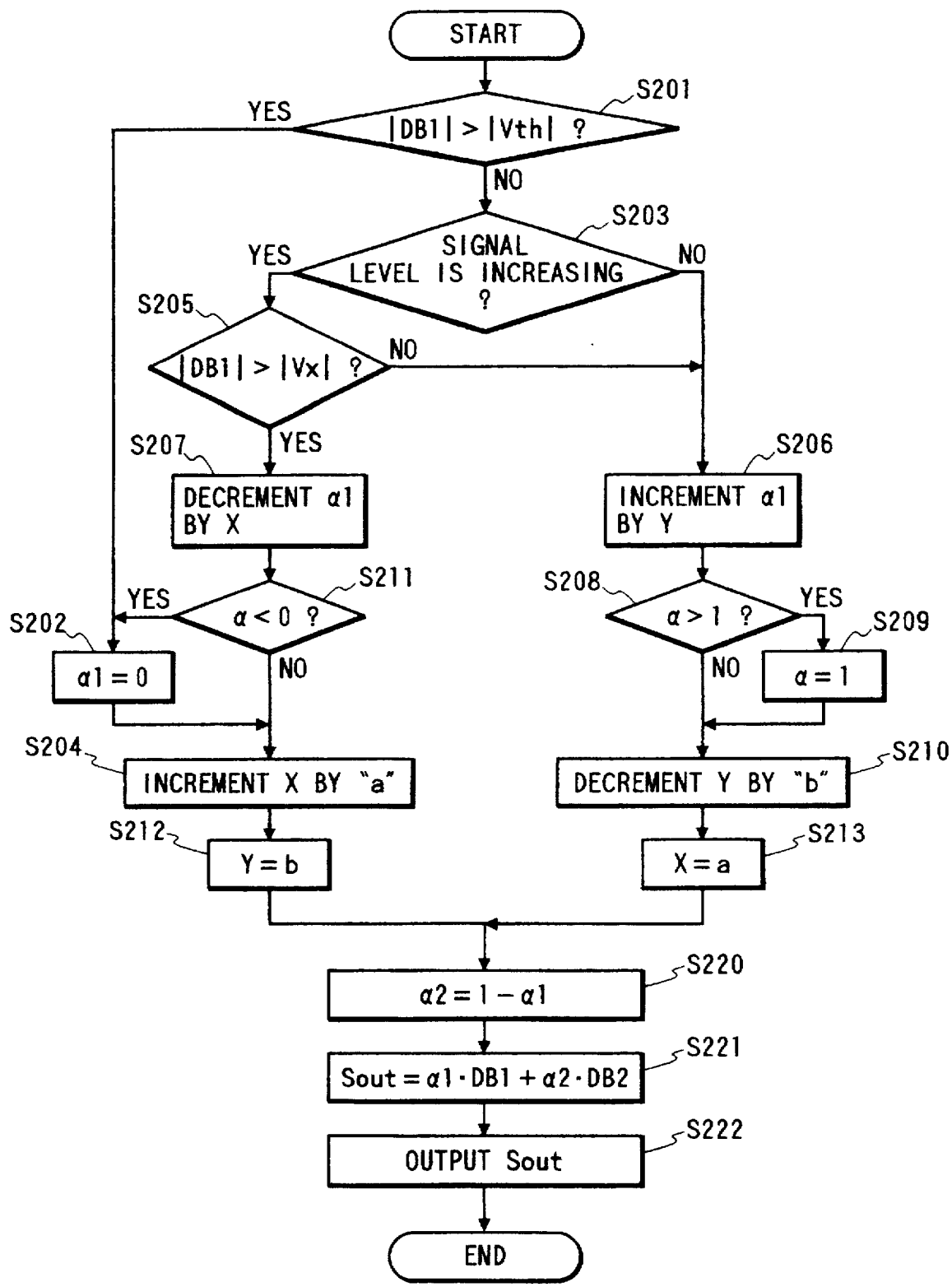
FIG. 27 is a flowchart of a segment of a program for controlling a digital signal processor in FIG. 26.

The digital signal processor 12F includes a combination of an input/output port (an interface), a processing section, a RAM, and a ROM. The digital signal processor 12F operates in accordance with a program stored in the ROM. FIG. 27 is a flowchart of a segment of the program which is executed for every sampling period related to the operation of A/D converters 2-1 and 2-2.

As shown in FIG. 27, a first step S201 of the program segment detects the level represented by the digital data sample DB1. The detected level is also denoted by DB1. The digital data level DB1 is used as an indication of the level of the input analog signal Si. Alternatively, the digital data level DB2 may be used as an indication of the level of the input analog signal Si. The step S201 compares the absolute value of the digital data level DB1 with the absolute value of a predetermined threshold level Vth. The predetermined threshold level Vth is slightly smaller than the clipping level related to an amplifier 1-1 or the full-scale over level related to the A/D converter 2-1. When the absolute value of the digital data level DB1 is greater than the absolute value of the predetermined threshold level Vth, the program advances from the step S201 to a step S202. Otherwise, the program advances from the step S201 to a step S203.

The step S202 sets a weight $\alpha 1$ to "0". The weight $\alpha 1$ is assigned to the digital data sample DB1. After the step S202, the program advances to a step S204.

The step S203 compares the current digital data level DB1 with the immediately-preceding digital data level DB1 to decide whether or not the digital data level DB1 is increasing. It should be noted that the immediately-preceding digital data level DB1 is available during the execution cycle of the program segment which immediately precedes the present execution cycle thereof. When the digital data level DB1 is increasing, the program advances from the step S203 to a step S205. Otherwise, the program advances from the step S203 to a step S206.

The step S205 compares the absolute value of the digital data level DB1 with the absolute value of a predetermined reference level Vx. The absolute value of the predetermined reference level Vx is smaller than the absolute value of the predetermined threshold level Vth. When the absolute value of the digital data level DB1 is greater than the absolute value of the predetermined reference level Vx, the program advances from the step S205 to a step S207. Otherwise, the program advances from the step S205 to the step S206.

The step S206 increments the weight $\alpha 1$ by a value Y. After the step S206, the program advances to a step S208. It should be noted that during the first execution cycle of the program segment, the value Y is initialized to a given value equal to, for example, "1/24".

The step S208 compares the weight $\alpha 1$ with "1". When the weight $\alpha 1$ is greater than "1", the program advances from the step S208 to a step S209. Otherwise, the program jumps from the step S208 to a step S210. The step S209 sets the weight $\alpha 1$ to "1". After the step S209, the program advances to the step S210.

The step S207 decrements the weight $\alpha 1$ by a value X. After the step S207, the program advances to a step S211. It should be noted that during the first execution cycle of the program segment, the value X is initialized to a given value equal to, for example, "1/12".

The step S211 compares the weight $\alpha 1$ with "0". When the weight $\alpha 1$ is smaller than "0", the program advances from the step S211 to the step S202. Otherwise, the program advances from the step S211 to the step S204.

The step S204 increments the value X by a value "a". It should be noted that during the first execution cycle of the program segment, the value "a" is initialized to a given value equal to, for example, "1/12". A step S212 following the step S204 sets the value Y to a value "b". After the step S212, the program advances to a step S220.

The step S210 decrements the value Y by the value "b". It should be noted that during the first execution cycle of the program segment, the value "b" is initialized to a given value equal to, for example, "1/24". A step S213 following the step S210 sets the value X to the value "a". After the step S213, the program advances to the step S220.

The step S220 sets a weight $\alpha 2$ to "1–$\alpha 1$". The weight $\alpha 2$ is assigned to the digital data sample DB2. After the step S220, the program advances to a step S221.

The step S221 multiplies the digital data sample DB1 by the weight $\alpha 1$, and thereby generates a digital data piece $\alpha 1 \cdot DB1$. Also, the step S221 multiplies the digital data sample DB2 by the weight $\alpha 2$, and thereby generates a digital data piece $\alpha 2 \cdot DB2$. The step S221 adds and combines the digital data pieces $\alpha 1 \cdot DB1$ and $\alpha 2 \cdot DB2$ into a sample (a time segment) of the final digital signal Sout. Accordingly, the sample of the final digital signal Sout is expressed as Sout=$\alpha 1 \cdot DB1$+$\alpha 2 \cdot DB2$. A step S222 following the step S221 outputs the sample of the final digital signal Sout. After the step S222, the current execution cycle of the program segment ends.

Figure 28:
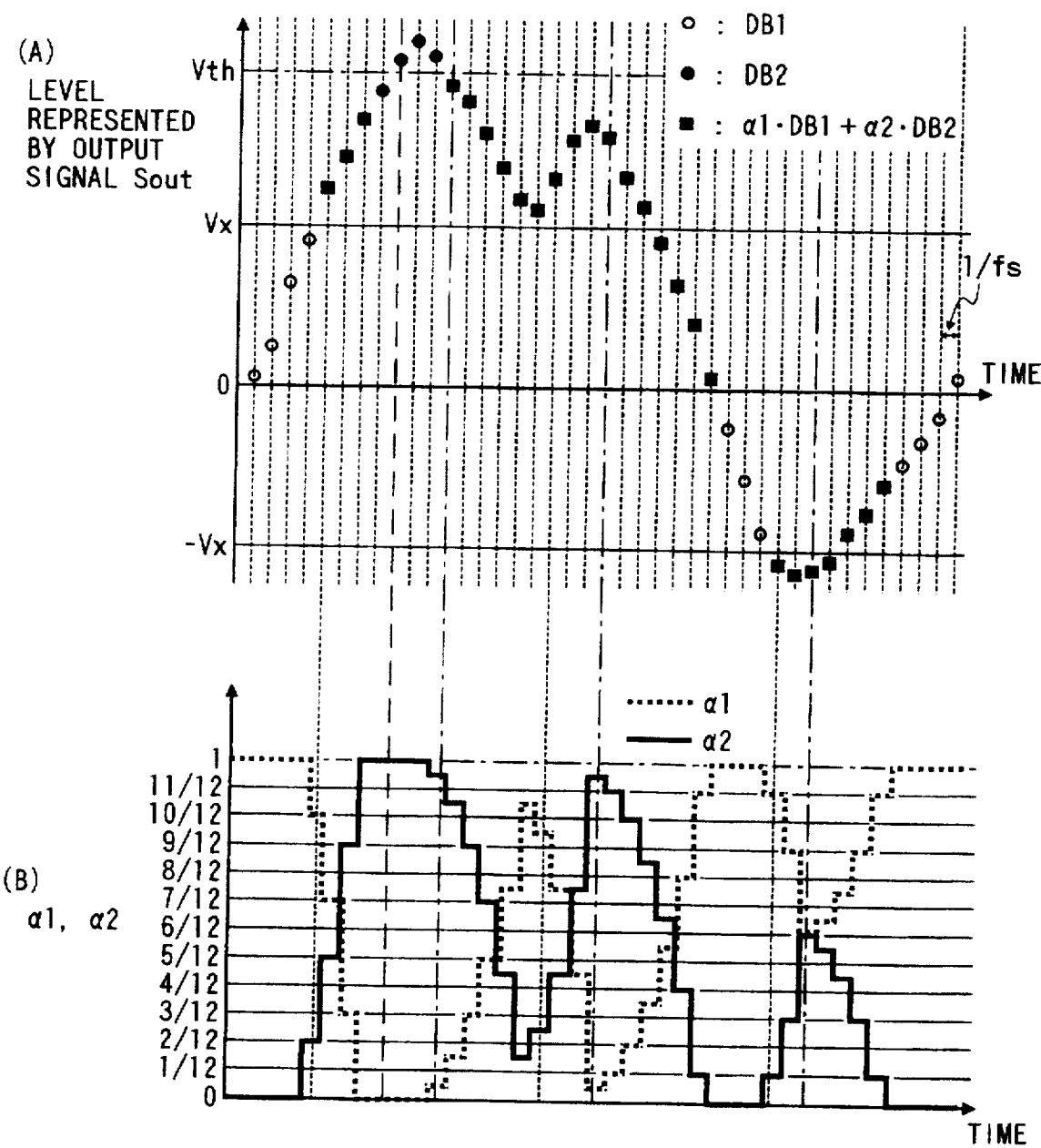
FIG. 28 is a time-domain diagram of a final output digital signal, and weights used in the apparatus of FIG. 26.

FIG. 28 shows an example of time-domain variations in the weights $\alpha 1$ and $\alpha 2$, and the level represented by the final output digital signal Sout. As shown in FIG. 28, in the case where the signal level is increasing, when the absolute value of the signal level is greater than the absolute value of the predetermined reference level Vx, the weights $\alpha 1$ and $\alpha 2$ are decremented and incremented respectively at a variable rate. In this case, the rate increases as the absolute value of the signal level rises.

As shown in FIG. 28, in the case where the signal level is decreasing or constant, the weights $\alpha 1$ and $\alpha 2$ are incremented and decremented respectively at a variable rate. In this case, the rate increases as the absolute value of the signal level drops.

As shown in FIG. 28, when the absolute value of the signal level is greater than the absolute value of the predetermined threshold level Vth, the final output digital signal Sout is formed only by the digital data sample DB2. In this case, the weight $\alpha 1$ is "0" while the weight $\alpha 2$ is "1".

Tenth Embodiment

Figure 29:
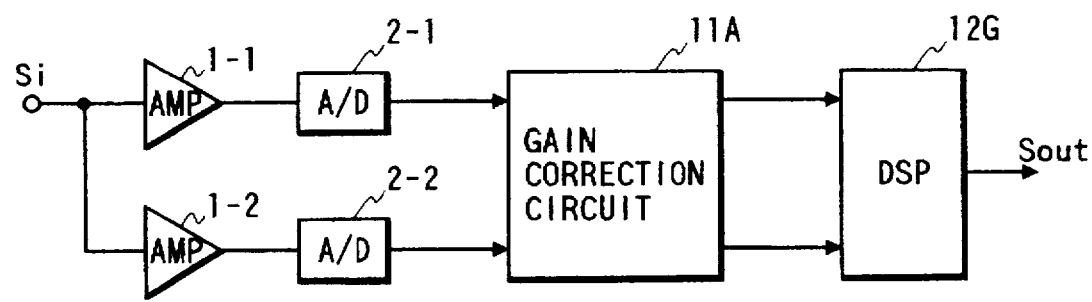
FIG. 29 is a block diagram of an analog-to-digital (A/D) conversion apparatus according to a tenth embodiment of this invention.

FIG. 29 shows an analog-to-digital (A/D) conversion apparatus according to a tenth embodiment of this invention. The A/D conversion apparatus of FIG. 29 is similar to the A/D conversion apparatus of FIG. 11 except that a digital signal processor (a DSP) 12G replaces the digital signal processor 12A (see FIG. 11).

The digital signal processor 12G generates a time segment (a sample) of a final digital signal Sout in response to digital data samples DB1 and DB2 fed from a gain correction circuit 11A. The digital signal processor 12G outputs the time segment of the final digital signal Sout as an indication of the result of analog-to-digital conversion of the sample of an input analog signal Si.

Figure 30:
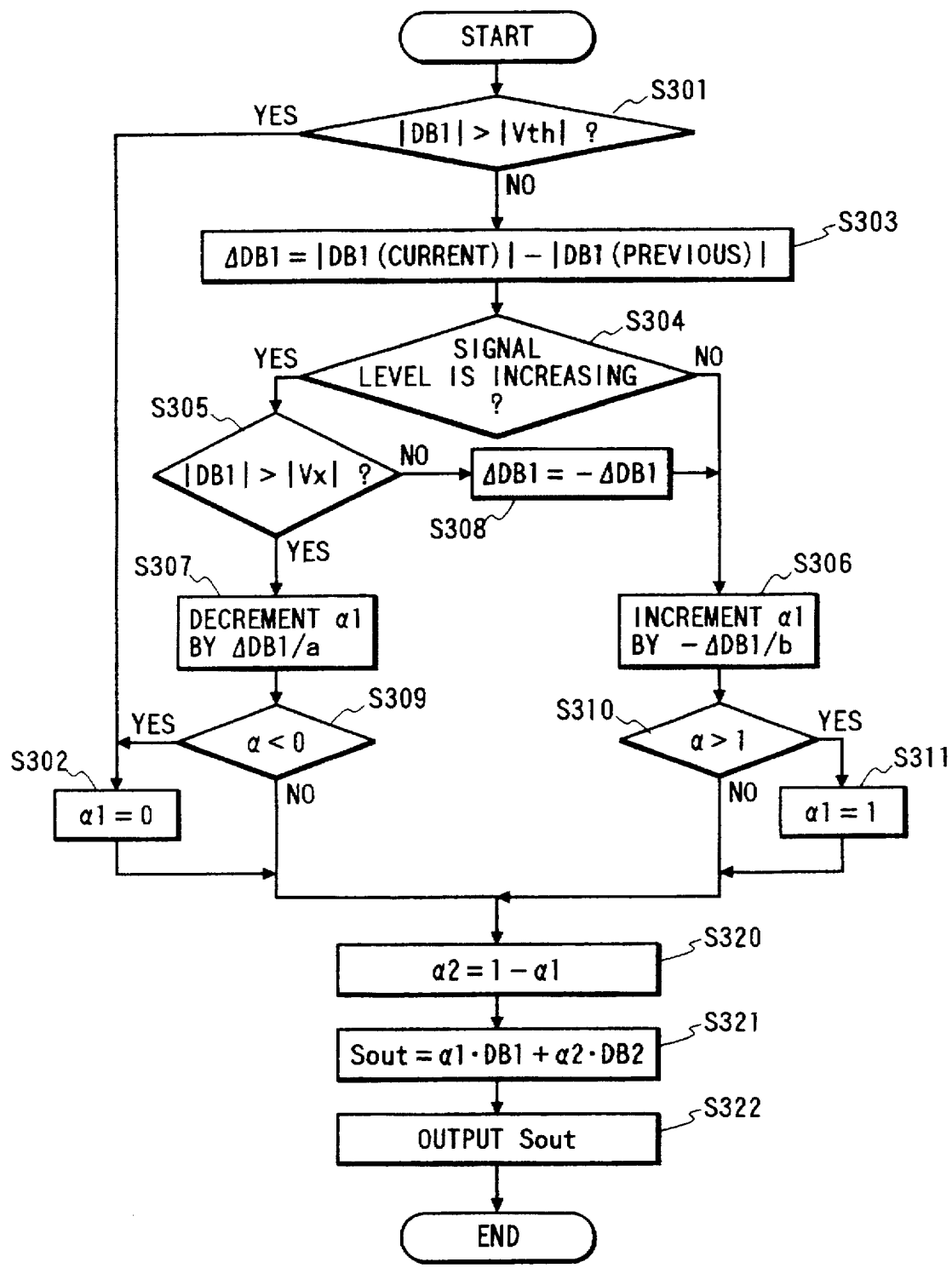
FIG. 30 is a flowchart of a segment of a program for controlling a digital signal processor in FIG. 29.

The digital signal processor 12G includes a combination of an input/output port (an interface), a processing section, a RAM, and a ROM. The digital signal processor 12G operates in accordance with a program stored in the ROM. FIG. 30 is a flowchart of a segment of the program which is executed for every sampling period related to the operation of A/D converters 2-1 and 2-2.

As shown in FIG. 30, a first step S301 of the program segment detects the level represented by the digital data sample DB1. The detected level is also denoted by DB1. The digital data level DB1 is used as an indication of the level of the input analog signal Si. Alternatively, the digital data level DB2 may be used as an indication of the level of the input analog signal Si. The step S301 compares the absolute value of the digital data level DB1 with the absolute value of a predetermined threshold level Vth. The predetermined threshold level Vth is slightly smaller than the clipping level related to an amplifier 1-1 or the full-scale over level related to the A/D converter 2-1. When the absolute value of the digital data level DB1 is greater than the absolute value of the predetermined threshold level Vth, the program advances from the step S301 to a step S302. Otherwise, the program advances from the step S301 to a step S303.

The step S302 sets a weight $\alpha 1$ to "0". The weight $\alpha 1$ is assigned to the digital data sample DB1. After the step S302, the program advances to a step S320.

The step S303 calculates the difference $\Delta DB1$ between the absolute value of the current digital data level DB1 (current) and the absolute value of the immediately-preceding digital data level DB1(previous) by referring to the equation as "$\Delta DB1$=|DB1(current)|–|DB1(previous)|". It should be noted that the immediately-preceding digital data level DB1 (previous) is available during the execution cycle of the program segment which immediately precedes the present execution cycle thereof. The calculated difference $\Delta DB1$ indicates the rate of variation in the digital signal level DB1.

A step S304 following the step S303 compares the variation rate $\Delta DB1$ with "0" to decide whether or not the digital data level DB1 is increasing. When the variation rate $\Delta DB1$ is equal to or greater than "0", that is, when the digital data level DB1 is constant or increasing, the program advances from the step S304 to a step S305. Otherwise, the program advances from the step S304 to a step S306.

The step S305 compares the absolute value of the digital data level DB1 with the absolute value of a predetermined reference level Vx. The absolute value of the predetermined reference level Vx is smaller than the absolute value of the predetermined threshold level Vth. When the absolute value of the digital data level DB1 is greater than the absolute value of the predetermined reference level Vx, the program advances from the step S305 to a step S307. Otherwise, the program advances from the step S305 to a step S308.

The step S308 inverts the sign of the variation rate $\Delta$DB1. After the step S308, the program advances to the step S306.

The step S307 divides the variation rate $\Delta$DB1 by a given value "a" to calculate a value $\Delta$DB1/a. The step S307 decrements the weight $\alpha$1 by the value $\Delta$DB1/a. After the step S307, the program advances to a step S309.

The step S309 compares the weight $\alpha$1 with "0". When the weight $\alpha$1 is smaller than "0", the program advances from the step S309 to the step S302. Otherwise, the program advances from the step S309 to the step S320.

The step S306 divides the variation rate $\Delta$DB1 by a given value "b" to calculate a value $\Delta$DB1/b. The step S306 increments the weight $\alpha$1 by the value $-\Delta$DB1/b. It should be noted that the value $\Delta$DB1/b is negative or zero in this case. After the step S306, the program advances to a step S310.

The step S310 compares the weight $\alpha$1 with "1". When the weight $\alpha$1 is greater than "1", the program advances from the step S310 to a step S311. Otherwise, the program jumps from the step S310 to the step S320.

The step S311 sets the weight $\alpha$1 to "1". After the step S311, the program advances to the step S320.

The step S320 sets a weight $\alpha$2 to "1-$\alpha$1". The weight $\alpha$2 is assigned to the digital data sample DB2. After the step S320, the program advances to a step S321.

The step S321 multiplies the digital data sample DB1 by the weight $\alpha$1, and thereby generates a digital data piece $\alpha$1·DB1. Also, the step S321 multiplies the digital data sample DB2 by the weight $\alpha$2, and thereby generates a digital data piece $\alpha$2·DB2. The step S321 adds and combines the digital data pieces $\alpha$1·DB1 and $\alpha$2·DB2 into a sample (a time segment) of the final digital signal Sout. Accordingly, the sample of the final digital signal Sout is expressed as Sout=$\alpha$1·DB1 and $\alpha$2·DB2. A step S322 following the step S321 outputs the sample of the final digital signal Sout. After the step S322, the current execution cycle of the program segment ends.

What is claimed is:

1. An analog-to-digital conversion apparatus comprising:
a plurality of amplifiers for amplifying a common input analog signal with predetermined different gains respectively;
a plurality of analog-to-digital converters for converting output signals of the amplifiers into corresponding first digital signals respectively, and for outputting the first digital signals respectively;
first means for deciding whether or not each of the first digital signals outputted by the analog-to-digital converters is in at least one of a given clipped state and a given full-scale over state;
second means for correcting the first digital signals outputted by the analog-to-digital converters into respective second digital signals representing substantially equal levels;
third means for, when the first means decides that none of the first digital signals is in at least one of the given clipped state and the given full-scale over state, selecting one out of all the second digital signals as a final digital output signal; and
fourth means for, when the first means decides that at least one of the first digital signals is in at least one of the clipped state and the full-scale over state, selecting one out of the second digital signals unrelated to said at least one of the first digital signals as a final digital output signal.

2. An analog-to-digital conversion apparatus as recited in claim 1, further comprising fifth means for, during a time interval after at least one of the first digital signals moves from at least one of the clipped state and the full-scale over state, continuing to select one out of the second digital signals unrelated to said at least one of the first digital signals as a final digital output signal.

3. An analog-to-digital conversion apparatus as recited in claim 1, wherein said second digital signal selected by the fourth means originates from the output signal of the amplifier having a highest gains among the amplifiers unrelated to said at least one of the first digital signals.

4. An analog-to-digital conversion apparatus as recited in claim 2, further comprising fifth means for detecting a condition of said at least one of the first digital signals being in at least one of the clipped state and the full-scale over state, and sixth means for controlling said time interval in response to the condition detected by the fifth means.

5. An analog-to-digital conversion apparatus as recited in claim 1, wherein said second digital signal selected by the third means originates from the output signal of the amplifier having a highest gains among all the amplifiers.

6. An analog-to-digital conversion apparatus comprising:
at least first and second amplifiers for amplifying a common input analog signal with first and second predetermined gains respectively, the first predetermined gain being higher than the second predetermined gain;
at least first and second analog-to-digital converters for converting output signals of the first and second amplifiers into corresponding first and second digital signals respectively;
first means for deciding whether or not the first digital signal is in a given saturated state;
second means for correcting the first and second digital signals into third and fourth digital signals respectively to compensate for a variation between the first and second predetermined gains, the third and fourth digital signals representing substantially equal levels;
third means for, when the first means decides that the first digital signal is not in the given saturated state, selecting the third digital signal from among the third and fourth digital signals as a final digital output signal; and
fourth means for, when the first means decides that the first digital signal is in the given saturated state, selecting the fourth digital signal from among the third and fourth digital signals as a final digital output signal.

7. An analog-to-digital conversion apparatus as recited in claim 6, further comprising fifth means for, during a time interval after the first digital signal moves out of the given saturated state, continuing to select the fourth digital signal from among the third and fourth digital signals as a final digital output signal.

8. An analog-to-digital conversion apparatus as recited in claim 7, further comprising sixth means for detecting a condition of the first digital signal being in the given saturated state, and seventh means for controlling said time interval in response to the condition detected by the sixth means.

9. A method of analog-to-digital conversion, comprising the steps of:
- amplifying a common input analog signal with predetermined different gains into amplification-resultant analog signals respectively;
- digitizing the amplification-resultant analog signals into corresponding first digital signals respectively;
- correcting the first digital signals into second digital signals respectively to compensate for a variation among the gains, the second digital signals representing substantially equal levels;
- comparing a level represented by specified one of the second digital signals with at least one predetermined reference level and deciding whether or not the level represented by the specified one of the second digital signals is increasing; and
- combining the second digital signals at a combination ratio which depends on whether or not the level represented by the specified one of the second digital signals is increasing into a final digital output signal.

10. A method as recited in claim 9, further comprising the step of causing a rate of a variation in the combination ratio which occurs when the level represented by the specified one of the second digital signals is increasing to be greater than a rate of a variation in the combination ratio which occurs when the level represented by the specified one of the second digital signals is not increasing.

11. A method as recited in claim 9, wherein a first given number of predetermined reference levels are used in the comparing when the level represented by the specified one of the second digital signals is increasing, and a second given number of predetermined reference levels are used in the comparing when the level represented by the specified one of the second digital signals is not increasing, the first given number being smaller than the second given number.

12. A method as recited in claim 9, wherein two predetermined reference levels different from each other are used in the comparing.

13. A method as recited in claim 9, further comprising the step of varying a rate of a variation in the combination ratio in response to the level represented by the specified one of the second digital signals.

14. An analog-to-digital conversion apparatus comprising:
- at least first and second amplifiers for amp ling a common input analog signal with first and second predetermined gains respectively, the first and second predetermined gains being different from each other;
- at least first and second analog-to-digital converters for converting output signals of the first and second amplifiers into corresponding first and second digital signals respectively;
- first means for correcting the first and second digital signals into third and fourth digital signals respectively to compensate for a variation between the first and second predetermined gains, the third and fourth digital signals representing substantially equal levels; and
- second means for combining the third and fourth digital signals into a final output digital signal.

15. An analog-to-digital conversion apparatus as recited in claim 14, wherein the second means comprises means for combining the third and fourth digital signals into the final output digital signal by weighted average.

16. An analog-to-digital conversion apparatus as recited in claim 14, wherein the second means comprises:
- means for deciding whether or not a level represented by one of the third and fourth digital signals is in a predetermined range; and
- means for combining the third and fourth digital signals into the final output digital signal when the level represented by one of the third and fourth digital signal is in the predetermined range.

17. An analog-to-digital conversion apparatus as recited in claim 14, wherein the second means comprises:
- means for combining the third and fourth digital signals at a variable combination ratio into the final output digital signal; and
- means for varying the combination ratio in response to a level represented by one of the third and fourth digital signals.

18. An analog-to-digital conversion apparatus as recited in claim 14, wherein the second means comprises:
- means for combining the third and fourth digital signals at a variable combination ratio into the final output digital signal;
- means for deciding whether or not a level represented by one of the third and fourth digital signal is increasing; and
- means for varying the combination ratio in response to whether or not the level represented by one of the third and fourth digital signal is increasing.

19. An analog-to-digital conversion apparatus comprising:
- at least first and second amplifiers for amplifying a common input analog signal with first and second predetermined gains respectively, the first and second predetermined gains being different from each other;
- at least first and second analog-to-digital converters for converting output signals of the first and second amplifiers into corresponding first and second digital signals respectively;
- first means for correcting the first and second digital signals into third and fourth digital signals respectively to compensate for a variation between the first and second predetermined gains, the third and fourth digital signals representing substantially equal levels; and
- second means for deciding which of first, second, and third predetermined ranges a level represented by one of the third and fourth digital signals is present in, the first, second, and third predetermined ranges being different from each other;
- third means for selecting the third digital signal as a final output digital signal when the second means decides that the level represented by one of the third and fourth digital signals is present in the first predetermined range;
- fourth means for combining the third and fourth digital signals into a final output digital signal when the second means decides that the level represented by one of the third and fourth digital signals is present in the second predetermined range; and
- fifth means for selecting the fourth digital signal as a final output digital signal when the second means decides that the level represented by one of the third and fourth digital signals is present in the third predetermined range.

20. An analog-to-digital conversion apparatus as recited in claim 19, wherein the fourth means comprises means for combining the third and fourth digital signals into the final output digital signal by weighted average.

21. An analog-to-digital conversion apparatus as recited in claim 19, wherein the fourth means comprises:
- means for combining the third and fourth digital signals at a variable combination ratio into the final output digital signal; and means for varying the combination ratio in response to the level represented by one of the third and fourth digital signals.

22. An analog-to-digital conversion apparatus as recited in claim 19, wherein the fourth means comprises:

means for combining the third and fourth digital signals at a variable combination ratio into the final output digital signal;

means for deciding whether or not the level represented by one of the third and fourth digital signal is increasing; and means for varying the combination ratio in response to whether or not the level represented by one of the third and fourth digital signal is increasing.

23. A method of analog-to-digital conversion, comprising the steps of:

amplifying a common input analog signal with predetermined different gains into amplification-resultant analog signals respectively;

digitizing the amplification-resultant analog signals into corresponding first digital signals respectively;

correcting the first digital signals into second digital signals respectively to compensate for a variation among the gains, the second digital signals representing substantially equal levels;

comparing a level represented by specified one of the second digital signals with at least one predetermined reference level; and combining the second digital signals at a combination ratio equal to either a first predetermined ratio or a second predetermined ratio different from the first predetermined ratio into a final digital output signal, the combination ratio depending on a result of said comparing.

24. A method of analog-to-digital conversion, comprising the steps of:

amplifying a common input analog signal with predetermined different gains into amplification-resultant analog signals respectively;

digitizing the amplification-resultant analog signals into corresponding first digital signals respectively;

correcting the first digital signals into second digital signals respectively to compensate for a variation among the gains, the second digital signals representing substantially equal levels;

comparing a level represented by specified one of the second digital signals with at least one predetermined reference level; and combining the second digital signals at a combination ratio changeable among at least three predetermined ratios different from each other into a final digital output signal, the combination ratio depending on a result of said comparing.

* * * * *